United States Patent
Tseng et al.

(10) Patent No.: US 10,510,383 B2
(45) Date of Patent: Dec. 17, 2019

(54) STATE DEPENDENT SENSE CIRCUITS AND PRE-CHARGE OPERATIONS FOR STORAGE DEVICES

(71) Applicant: SanDisk Technologies LLC, Plano, TX (US)

(72) Inventors: Tai-Yuan Tseng, Milpitas, CA (US); Anirudh Amarnath, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/723,422

(22) Filed: Oct. 3, 2017

(65) Prior Publication Data

US 2019/0103145 A1    Apr. 4, 2019

(51) Int. Cl.
| | | |
|---|---|---|
| G11C 7/00 | (2006.01) | |
| G11C 7/12 | (2006.01) | |
| G11C 16/24 | (2006.01) | |
| G11C 29/12 | (2006.01) | |
| G11C 16/34 | (2006.01) | |
| G11C 16/26 | (2006.01) | |
| G11C 11/56 | (2006.01) | |
| G11C 16/08 | (2006.01) | |
| G11C 16/04 | (2006.01) | |

(52) U.S. Cl.
CPC ............ *G11C 7/12* (2013.01); *G11C 11/5642* (2013.01); *G11C 16/08* (2013.01); *G11C 16/24* (2013.01); *G11C 16/26* (2013.01); *G11C 16/34* (2013.01); *G11C 16/3459* (2013.01); *G11C 29/12* (2013.01); *G11C 11/5628* (2013.01); *G11C 16/0483* (2013.01); *G11C 2211/5642* (2013.01)

(58) Field of Classification Search
CPC ......................................................... G11C 7/12
USPC ........................................................ 365/203
See application file for complete search history.

(56) References Cited

U.S. PATENT DOCUMENTS

| | | | |
|---|---|---|---|
| 2008/0084758 A1* | 4/2008 | Wang ..................... | G11C 7/067 365/185.21 |
| 2009/0296469 A1 | 12/2009 | Guterman | |
| 2011/0063920 A1* | 3/2011 | Moschiano .............. | G11C 7/02 365/185.21 |
| 2011/0205814 A1* | 8/2011 | Cho ........................ | G11C 7/062 365/189.11 |
| 2012/0008410 A1 | 1/2012 | Huynh et al. | |
| 2012/0250425 A1 | 10/2012 | Yoshihara et al. | |
| 2013/0223154 A1 | 8/2013 | Lutze et al. | |

(Continued)

*Primary Examiner* — Hoai V Ho
(74) *Attorney, Agent, or Firm* — Foley & Lardner LLP

(57) ABSTRACT

A circuit includes selected sense circuits configured to be connected to selected bit lines and unselected sense circuits configured to be connected to unselected bit lines during a sense operation. The selected and unselected sense circuits are configured to perform a state-dependent pre-charge operation during the sense operation. In particular, the selected sense circuits may enable respective pre-charge circuit paths that supply a pre-charge supply voltage to respective sense nodes in the selected sense circuits. Additionally, the unselected sense circuits may disable respective pre-charge circuit paths to prevent the supply of the pre-charge supply voltage to respective sense nodes in the unselected sense circuits. A sense circuit controller may control latches to control the enabling and disabling of the pre-charge circuit paths.

16 Claims, 14 Drawing Sheets

(56) References Cited

U.S. PATENT DOCUMENTS

| | | |
|---|---|---|
| 2013/0279254 A1 | 10/2013 | Kamata et al. |
| 2013/0279255 A1 | 10/2013 | Kamata et al. |
| 2013/0286738 A1 | 10/2013 | Kamata |
| 2013/0294157 A1 | 11/2013 | Sharon et al. |
| 2014/0003157 A1 | 1/2014 | Mui et al. |
| 2014/0119126 A1 | 5/2014 | Dutta et al. |
| 2014/0133229 A1 | 5/2014 | Kamei et al. |
| 2014/0269093 A1 | 9/2014 | Maejima |
| 2014/0269094 A1 | 9/2014 | Maeda |
| 2014/0286101 A1 | 9/2014 | Ito |
| 2014/0286104 A1 | 9/2014 | Kamata et al. |
| 2015/0049553 A1 | 2/2015 | Maejima |
| 2015/0071005 A1 | 3/2015 | Maejima et al. |
| 2015/0221348 A1 | 8/2015 | Tseng et al. |
| 2015/0221391 A1 | 8/2015 | Tseng et al. |
| 2015/0380099 A1 | 12/2015 | Maejima |
| 2016/0078929 A1 | 3/2016 | Maejima |
| 2016/0078953 A1 | 3/2016 | Bushnaq et al. |
| 2016/0086674 A1 | 3/2016 | Ray et al. |
| 2016/0189777 A1 | 6/2016 | Yoshihara et al. |
| 2016/0189790 A1 | 6/2016 | Ma et al. |
| 2016/0203874 A1 | 7/2016 | Maejima |
| 2016/0267971 A1 | 9/2016 | Maejima |
| 2016/0268001 A1 | 9/2016 | Harada |
| 2016/0351254 A1 | 12/2016 | Li et al. |
| 2016/0351722 A1 | 12/2016 | Zhou et al. |
| 2017/0076812 A1 | 3/2017 | Chu et al. |
| 2017/0116076 A1 | 4/2017 | Sharma et al. |
| 2017/0125117 A1 | 5/2017 | Tseng et al. |

\* cited by examiner

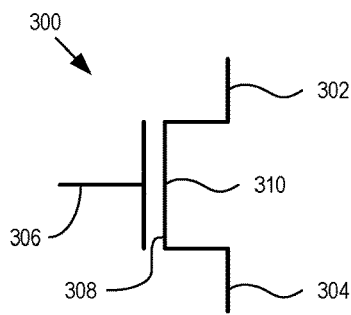
FIG. 3
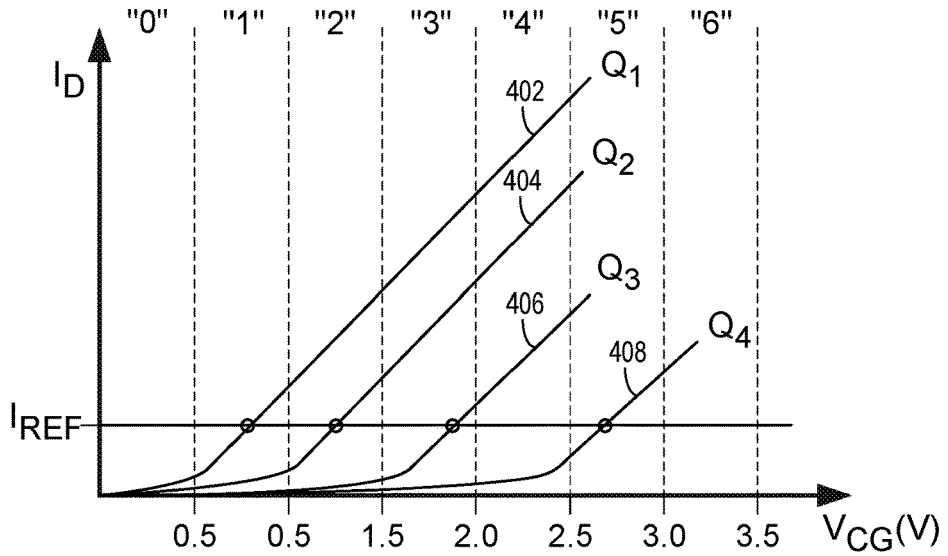
FIG. 4
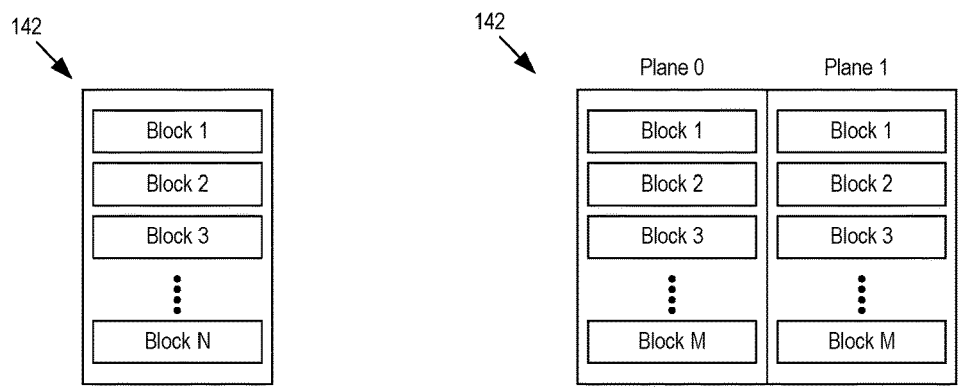
FIG. 5A
FIG. 5B

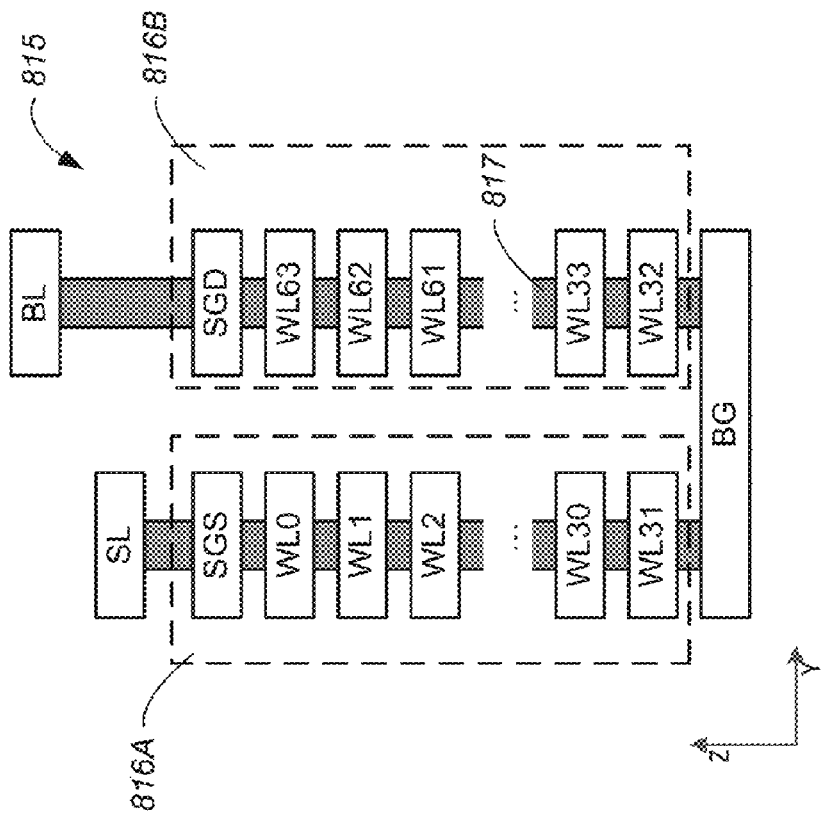
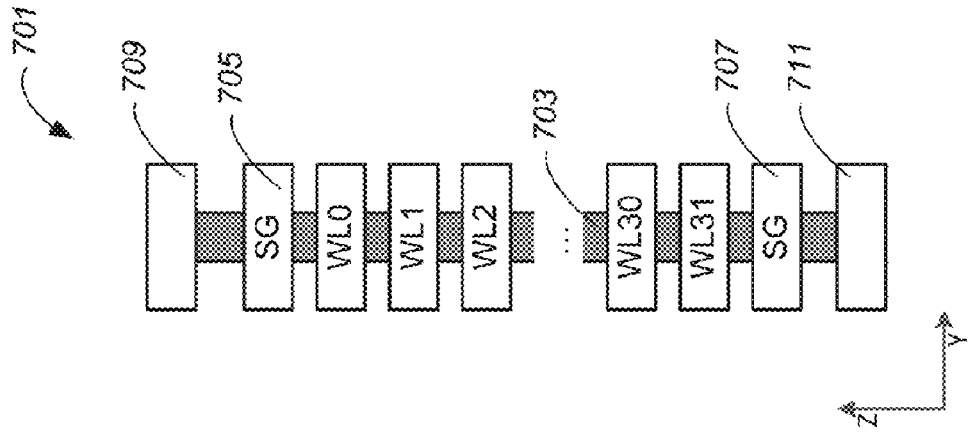
*FIG. 8*
*FIG. 7*

STATE DEPENDENT SENSE CIRCUITS AND PRE-CHARGE OPERATIONS FOR STORAGE DEVICES

BACKGROUND

In storage devices, sense amplifiers are included on memory dies to sense current flowing through bit lines in order to determine the data values of the data that memory cells are storing or in order to verify that data has been correctly programmed into the memory cells. During a sense operation, some bit lines of a block are selected while others are unselected. Whether a given bit line is selected or unselected may depend on whether a sense controller desires to know the current flow through that bit line.

A sense amplifier may include a sense node that generates a sense voltage at a level corresponding to charge accumulated at the sense node. A sense operation includes a discharge period during which accumulated charge may discharge according to current flowing through an associated bit line. In turn, the sense voltage may drop to a discharge level after a certain amount of time that indicates the current flow through the bit line. Prior to the discharge period, the sense amplifier may perform a pre-charge operation, during which the sense node generates the sense voltage at a pre-charge level. Generating the sense voltage at the pre-charge level may be unnecessary for sense amplifiers connected to unselected bit lines. As such, sense amplifiers connected to unselected bit lines that perform pre-charge operations may unnecessarily consume power. Accordingly, ways to configure the sense circuitry so that sense amplifiers connected to unselected bit lines do not perform the pre-charge operations may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3 is a circuit diagram of an example floating gate transistor.

FIG. 4 is a graph of curves of drain-to-source current as a function of control gate voltage drawn through a floating gate transistor.

FIG. 5A is a block diagram of a plurality of memory cells organized into blocks.

FIG. 5B is a block diagram of a plurality of memory cells organized into blocks in different planes.

FIG. 7 is an example physical structure of a three-dimensional (3-D) NAND string.

FIG. 8 is an example physical structure of a U-shaped 3-D NAND string.

DETAILED DESCRIPTION

Overview

Figure 1A:
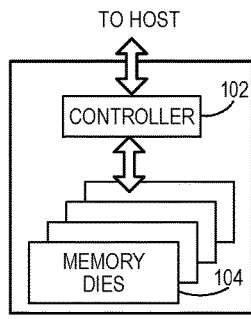
FIG. 1A is a block diagram of an exemplary non-volatile memory system.

By way of introduction, the below embodiments relate to apparatus, devices, systems, circuits, and methods for performing state-dependent pre-charge operations and threshold voltage tracking processes. In a first embodiment, a circuit includes a sense circuit coupled to a bit line, and a latch circuit. The sense circuit includes a pre-charge circuit path configured to pre-charge a sense node with a voltage at a pre-charge level during a sense operation. The latch circuit is configured to enable the pre-charge circuit path to pre-charge the sense node with the voltage at the pre-charge level in response to the bit line comprising a selected bit line, and disable the pre-charge circuit path to prevent the pre-charge circuit path from pre-charging the sense node with the voltage at the pre-charge level in response to the bit line comprising an unselected bit line.

In some embodiments, the circuit of claim 1, the sense circuit includes a discharge circuit path configured to discharge charge accumulated on the sense node before the pre-charge circuit path pre-charges the sense node with the voltage at the pre-charge level during the sense operation.

In some embodiments, transistors that form the pre-charge circuit path to pre-charge the sense node are the same transistors that form the discharge path to discharge charge accumulated on the sense node.

In some embodiments, the transistors are configured to be alternatingly connected to a voltage source and a ground reference, wherein the transistors are configured to connect to the voltage source to receive a supply voltage while forming the pre-charge circuit path, and are configured to connect to the ground reference while forming the discharge circuit path.

In some embodiments, a communications bus connects the sense circuit and the latch circuit. The latch circuit is configured to pull down a voltage of the communications bus to an associated low voltage level to disable the pre-charge circuit path.

In some embodiments, the latch circuit is configured to perform a latch read operation to disable the pre-charge circuit path.

In some embodiments, a communications bus connects the sense circuit and the latch circuit, and the latch circuit is configured to receive a control signal to perform the latch read operation. Also, the latch circuit is configured to set a voltage of the communications bus to a low voltage level to disable the pre-charge circuit path in response to the control signal when the bit line comprises an unselected bit line, and the latch circuit is configured to float relative to the communications bus to enable the pre-charge circuit path in response to the control signal when the bit line comprises a selected bit line.

In some embodiments, the pre-charge circuit path is configured to pre-charge the sense node to generate a sense voltage at an initial pre-charge level. Additionally, a threshold voltage tracking circuit path configured to configure the sense transistor as a diode-connected transistor to generate the sense voltage at a final pre-charge level.

In some embodiments, a voltage source is configured to output a supply voltage to generate a threshold voltage tracking voltage at a source terminal of the sense transistor. A voltage difference between the initial pre-charge level of the sense voltage and a level of the threshold voltage tracking voltage is a maximum threshold voltage of the sense transistor.

In some embodiments, a charge-storing circuit is connected to the sense node, and the charge-storing circuit is configured to receive an input pulse to increase the sense voltage. Also, the voltage source is configured to increase the threshold voltage tracking voltage to coincide with the increase of the sense voltage in response to receipt of the input pulse.

In some embodiments, a sense circuit controller is configured to lower the threshold voltage tracking voltage in preparation of the increase of the threshold voltage tracking voltage.

In a second embodiment, a circuit includes a sense circuit coupled to a bit line. The sense circuit includes a pre-charge circuit path, a threshold voltage tracking path, and a charge-storing circuit. The pre-charge circuit path is configured to receive, at a first node, a first voltage; and increase a sense voltage at a sense node to an initial pre-charge level in response to the first voltage. The threshold voltage tracking path is configured to receive, at a second node, a second voltage; and change the sense voltage from the initial pre-charge level to a final pre-charge level that tracks a threshold voltage of a sense transistor in response to the second voltage. The charge-storing circuit is coupled to the sense node and configured to receive an input pulse, and increase the sense voltage at the sense node from the final pre-charge level to a charge level in response to receipt of the input pulse.

In some embodiments, transistors of the pre-charge circuit path are configured to form a discharge circuit path configured to discharge charge accumulated at the sense node.

In some embodiments, the threshold voltage tracking path is configured to configure the sense transistor as a diode-connected transistor to change the sense voltage to the final pre-charge level.

In some embodiments, the circuit also includes a latch circuit, a communications bus configured to connect the sense circuit and the latch circuit, and a controller. The controller is configured to determine that the bit line comprises an unselected bit line, and in response to the determination, cause the latch circuit to pull down a voltage of the communications bus to an associated low voltage level to prevent the pre-charge circuit path from increasing the sense voltage to the initial pre-charge level.

In some embodiments, a latch circuit is configured to execute a read operation to disable the pre-charge circuit path in response to the bit line comprising an unselected bit line.

In some embodiments, a controller is configured to output a control signal to the latch circuit to cause the latch circuit to execute the read operation. The latch circuit is prevented from disabling the pre-charge circuit path in response to receipt of the control signal when the bit line comprises a selected bit line.

In a third embodiment, a system includes a memory block comprising memory cells and a plurality of bit lines connected to the memory cells, a first sense circuit, a first latch circuit, a second sense circuit, and a second latch circuit. The first sense circuit is connected to a first bit line of the plurality of bit lines during a sense operation, and includes a first transistor configured to supply a pre-charge supply voltage to a first sense node. The first latch circuit is configured to turn on the first transistor in response to the first bit line comprising a selected bit line in order to allow the first transistor to supply the pre-charge supply voltage. The second sense circuit is connected to a second bit line of the plurality of bit lines during the sense operation, and includes a second transistor configured to supply the pre-charge supply voltage to a second sense node. The second latch circuit is configured to turn off the second transistor in response to the second bit line comprising an unselected bit line in order to prevent the second transistor from supplying the pre-charge supply voltage.

In some embodiments, a communications bus is connected to a gate terminal of the second transistor, and the second latch circuit is configured to set a voltage of the second communications bus during a pre-charge period of the sense operation to turn off the second transistor.

In some embodiments, a controller is configured to output a control signal to the second latch circuit to cause the second latch circuit to perform a latch read operation during the pre-charge period, and the second latch circuit is configured to set the voltage of the second communications bus to turn off the second transistor in response to receipt of the control signal.

Other embodiments are possible, and each of the embodiments can be used alone or together in combination. Accordingly, various embodiments will now be described with reference to the attached drawings.

EMBODIMENTS

The following embodiments describe apparatuses, devices, systems, and methods for performing sense operations that state-dependent pre-charge operations and threshold voltage tracking processes. The embodiments may include a sense circuit that has a pre-charge circuit path configured to pre-charge a sense node with a voltage at a pre-charge voltage level during a pre-charge period of a sense operation. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
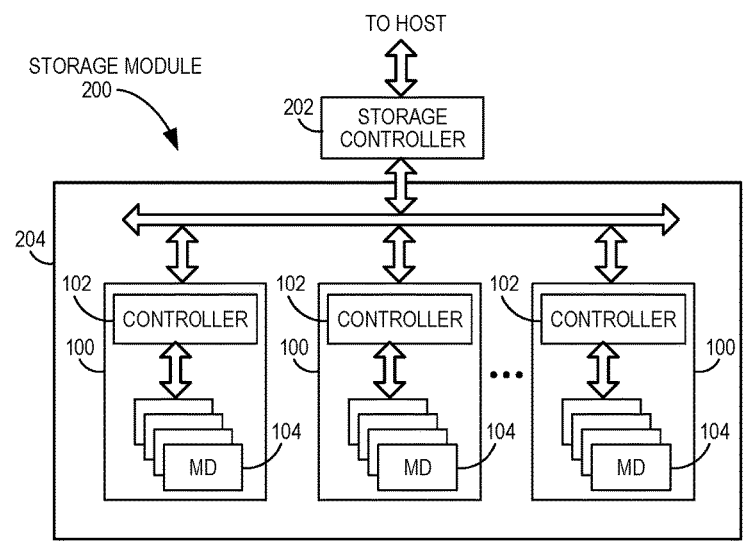
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
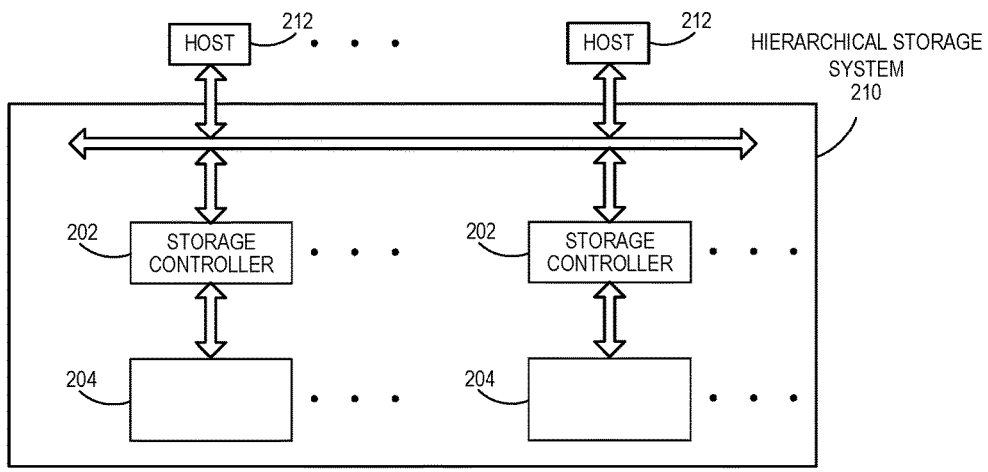
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
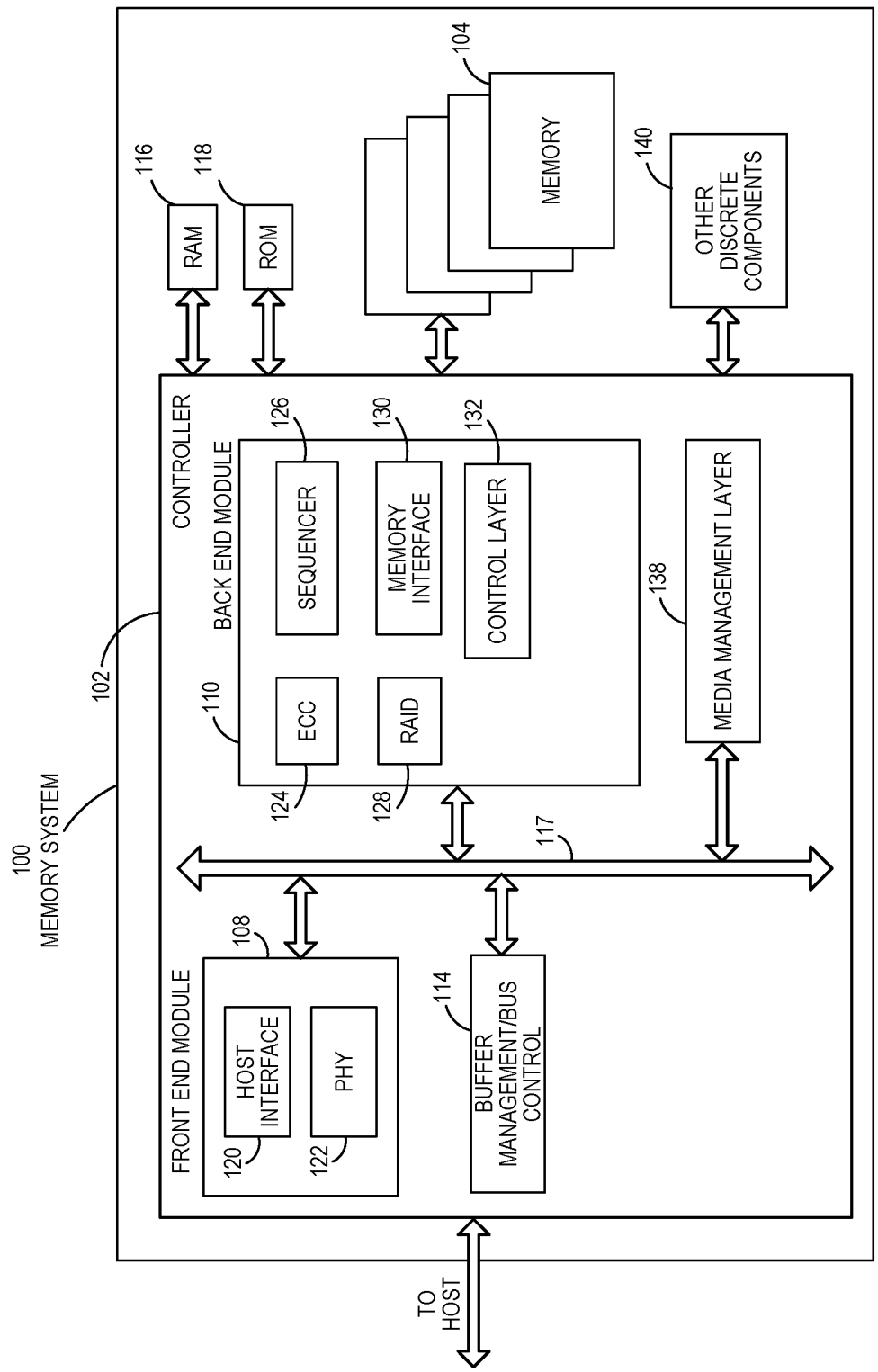
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
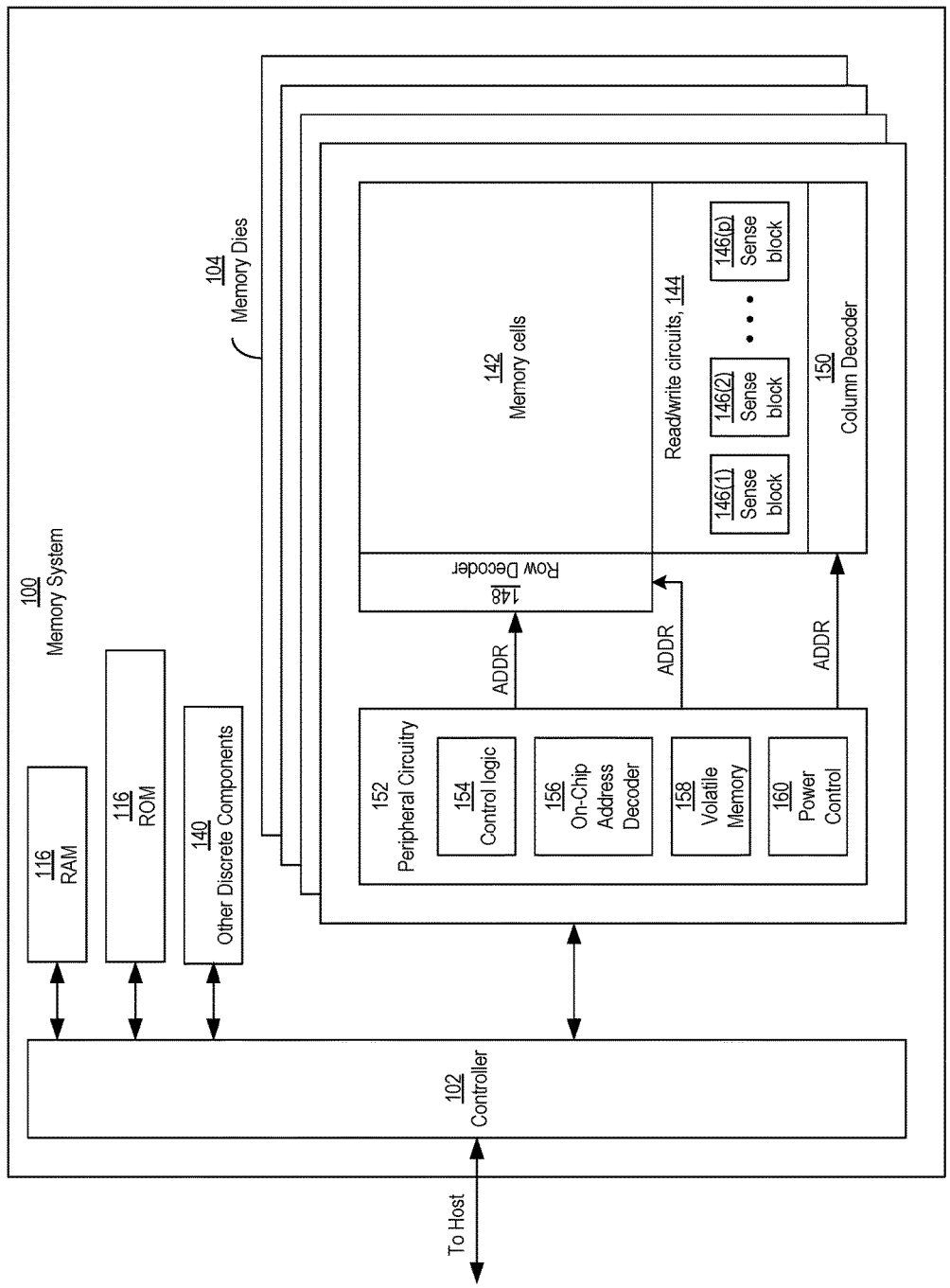
FIG. 2B is a block diagram of exemplary components of a non-volatile memory die of the non-volatile memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

For some memory configurations, such as flash memory, a memory cell of the plurality of memory cells 142 may be a floating gate transistor (FGT). FIG. 3 shows a circuit schematic diagram of an example FGT 300. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. For each given charge stored in the floating gate 308, a corresponding drain-to-source conduction current ID with respect to a fixed control gate Voltage $V_{CG}$ applied to the control gate 306 occurs. Additionally, the FGT 300 may have an associated range charges that can be programmable onto its floating gate 308 that define a corresponding threshold voltage window or a corresponding conduction current window. In this way, the FGT's threshold voltage may be indicative of the data stored in the memory cell.

FIG. 4 is graph showing four curves 402, 404, 406, 408 of drain-to-source current ID drawn through the FGT 300 as a function of a control gate voltage $V_{CG}$ applied to the control gate 306. Each curve 402-408 corresponds to a respective one of four different charges or charge levels Q1, Q2, Q3, Q4 that the floating gate 308 can selectively store at any given time. Otherwise stated, the four curves 402-408 represent four possible charge levels that can be programmed on the floating gate 308 of the FGT 300, respectively corresponding to four possible memory states. In the example graph in FIG. 4, the threshold voltage window of a population of FGTs range from 0.5 volts (V) to 3.5 V. Seven possible memory states "0", "1", "2", "3", "4", "5", and "6" are defined or extend across the threshold voltage window, and respectively represent one erased states and six programmed states. The different states can be demarcated by partitioning the threshold voltage window into six regions of 0.5 V intervals. The FGT 300 may be in one of the states according to the charge stored in its floating gate 308 and where its drain-to-source current ID intersects a reference current IREF. For example, a FGT programmed to store charge Q1 in memory state "1" since its curve 402 intersects the reference current IREF in a region of the threshold voltage region demarcated by the control gate voltage $V_{CG}$ in a range from 0.5 V to 1.0 V. The more memory states the FGT 300 is programmed to store, the more finely divided are the regions defining the threshold voltage window. In some examples configurations, the threshold voltage window may extend from −1.5 V to 5 V, providing a maximum width of 6.5 V. If the FGT 300 can be programmed into any one of sixteen possible states, each state may occupy a respective region spanning 200 millivolts (mV) to 300 mV. The higher the resolution of the threshold voltage window (i.e., more states into which the FGT 300 can be programmed), the higher the precision that is needed in programming and reading operations to successfully read and write data. Further description of memory states and threshold voltages is provided in further detail below with respect to programming, program verify, and read operations.

Referring to FIG. 5A, the memory cells 142 may be organized into an N-number of blocks, extending from a first block Block 1 to an Nth block Block N. Referring to FIG. 5B, for some example configurations, the N-number of blocks are organized into a plurality of planes. FIG. 5B shows an example configuration where the blocks are organized into two planes, including a first plane Plane 0 and a second plane Plane 1. Each plane is shown as included an M-number of blocks, extending from a first block Block 1 to an Mth block Block M. Data stored in different planes may be sensed simultaneously or independently.

For configurations where the memory cells are organized into a two-dimensional array, the memory cells may be configured in a matrix-like structure of rows and columns in each of the blocks. At the intersection of a row and a column is a memory cell. A column of memory cells is a referred to as a string, and memory cells in a string are electrically connected in series. A row of memory cells is referred to as a page. Where the memory cells are FGTs, control gates of FGTs in a page or row may be electrically connected together.

Additionally, each of the blocks includes word lines and bit lines connected to the memory cells. Each page of memory cells is coupled to a word line. Where the memory cells are FGTs, each word line may be coupled to the control gates of the FGTs in a page. In addition, each string of memory cells is coupled to a bit line. Further, a single string may span across multiple word lines, and the number of memory cells in a string may be equal to the number of pages in a block.

Figure 6:
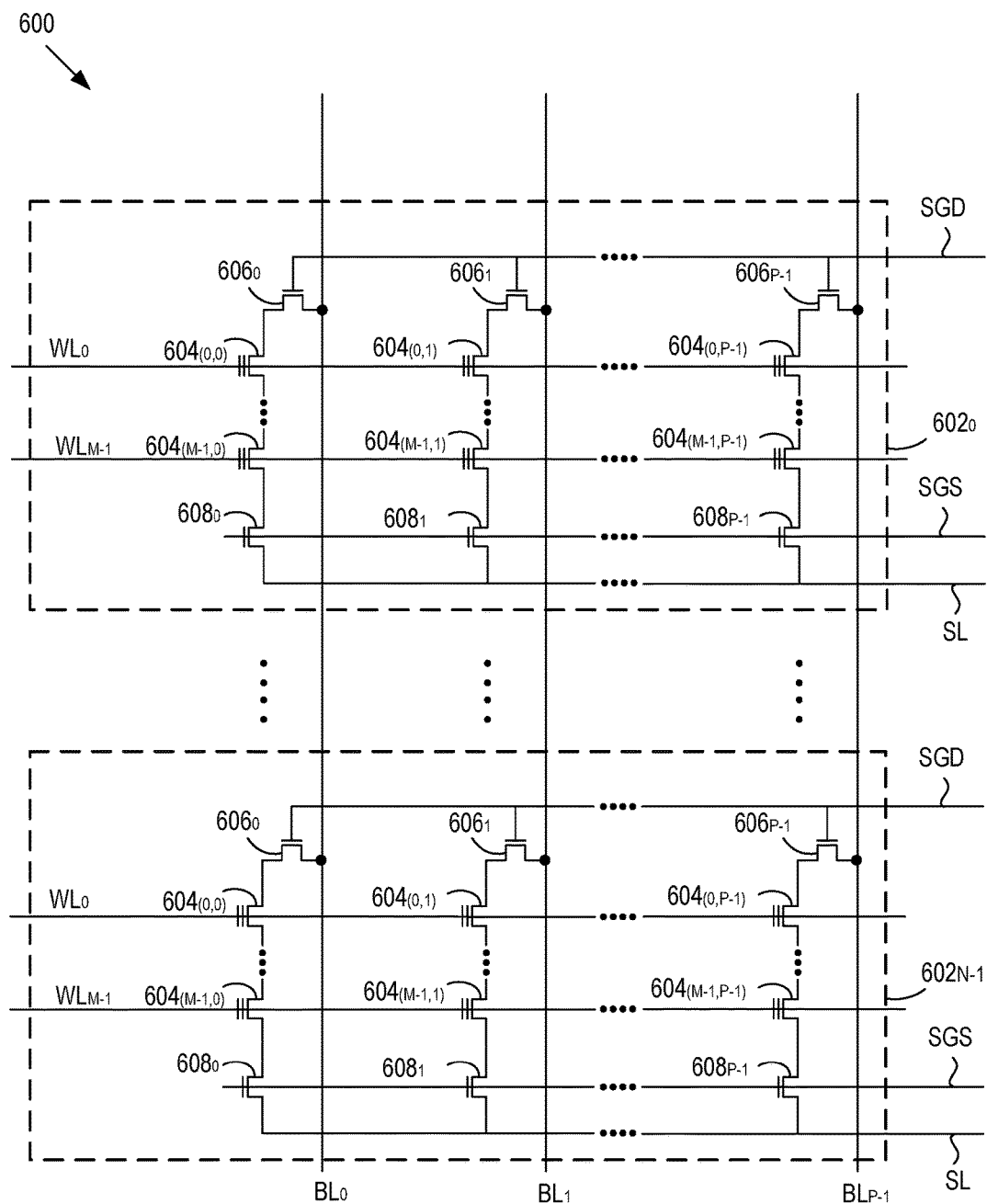
FIG. 6 is a circuit diagram of an example two-dimensional NAND-type flash memory array.

FIG. 6 is a circuit schematic diagram of at least a portion of an exemplary two-dimensional NAND-type flash memory array 600, which may be representative of at least a portion of the plurality of memory cells 142. For example, the memory array 600 may be representative of a single plane of blocks on a memory die 104. The memory array 600 may include an N-number of blocks $602_0$ to $602_{N-1}$. Each block 602 includes a P-number of strings of FGTs 604, with each string coupled to respective one of a P-number of bit lines $BL_0$ to $BL_{P-1}$. Additionally, each block 602 includes an M-number of pages of FGTs 604, with each page coupled to a respective one of an M-number of word lines $WL_0$ to $WL_{M-1}$. Each ith, jth FGT(i,j) of a given block 602 is connected to an ith word line $WL_i$ and to a jth bit line $BL_j$ of the given block. As shown in FIG. 6, bit lines $BL_0$ to $BL_{P-1}$ are shared among the blocks $602_0$ to $602_{N-1}$ may be which are shared among the blocks, such as blocks within the same plane.

Within each block 602, each string is connected at one end to an associated drain select gate transistor 606, and each string is coupled to its associated bit line BL via the associated drain select gate transistor 606. Switching of the drain select gate transistors $606_0$ to $606_{P-1}$ may be controlled using a drain select gate bias line SGD that supplies a drain select gate bias voltage $V_{SGD}$ to turn on and off the drain select transistors $606_0$ to $606_{P-1}$. In addition, within each block 602, each string is connected at its other end to an associated source select gate transistor 608, and each string is coupled to a common source line SL via the associated source select gate transistor 608. Switching of the source select gate transistors $608_0$ to $608_{P-1}$ may be controlled using a source select gate bias line SGS that supplies a source select gate bias voltage $V_{SGS}$ to turn on and off the source select transistors $608_0$ to $608_{P-1}$. Also, although not shown, in some cases, dummy word lines, which contain no user data, can also be used in the memory array 600 adjacent to the source select gate transistors $608_0$ to $608_{P-1}$. The dummy word lines may be used to shield edge word lines and FGTs from certain edge effects.

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with two-dimensional (planar) NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
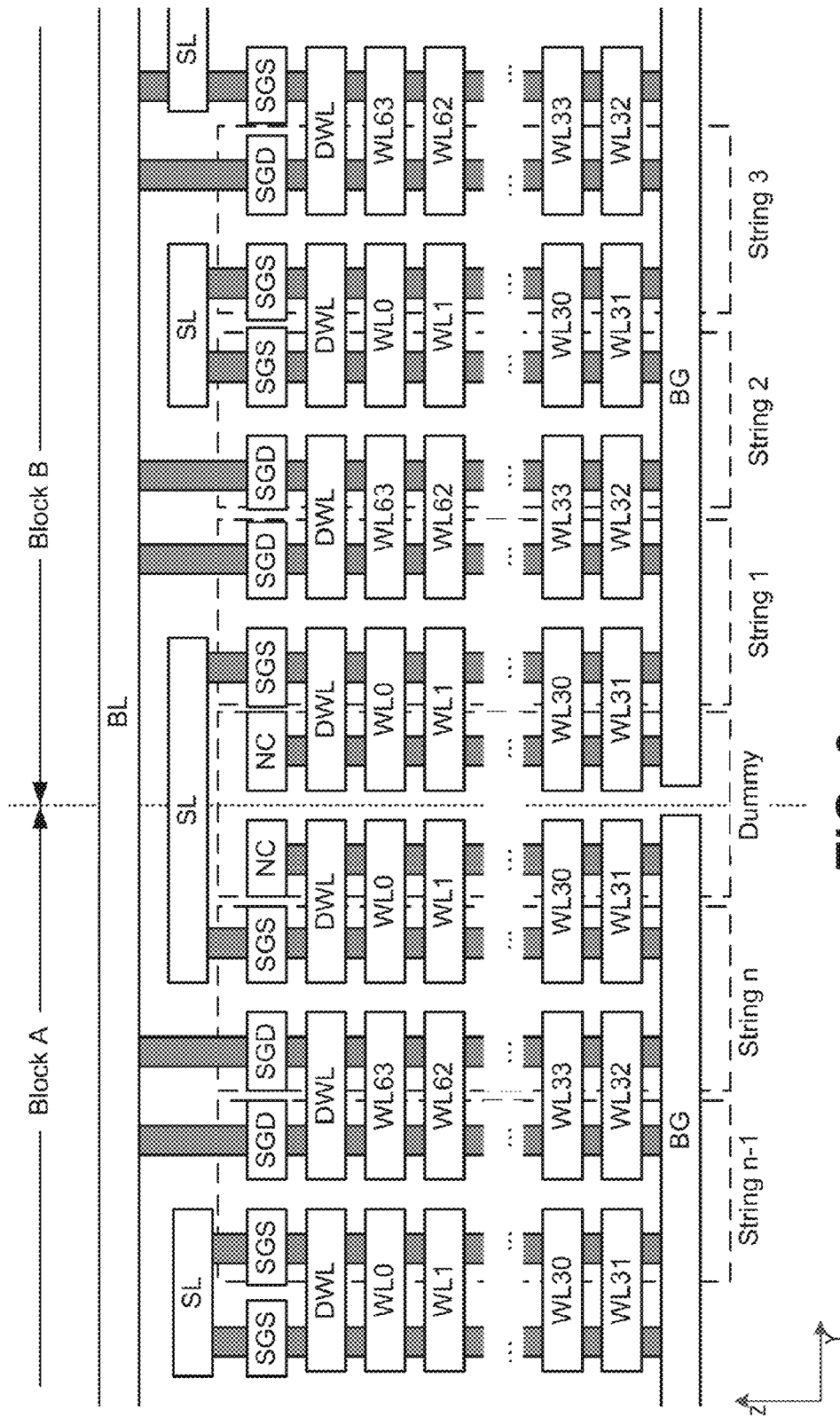
FIG. 9 is a cross-sectional view of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n separately-selectable sets of strings (String 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10A:
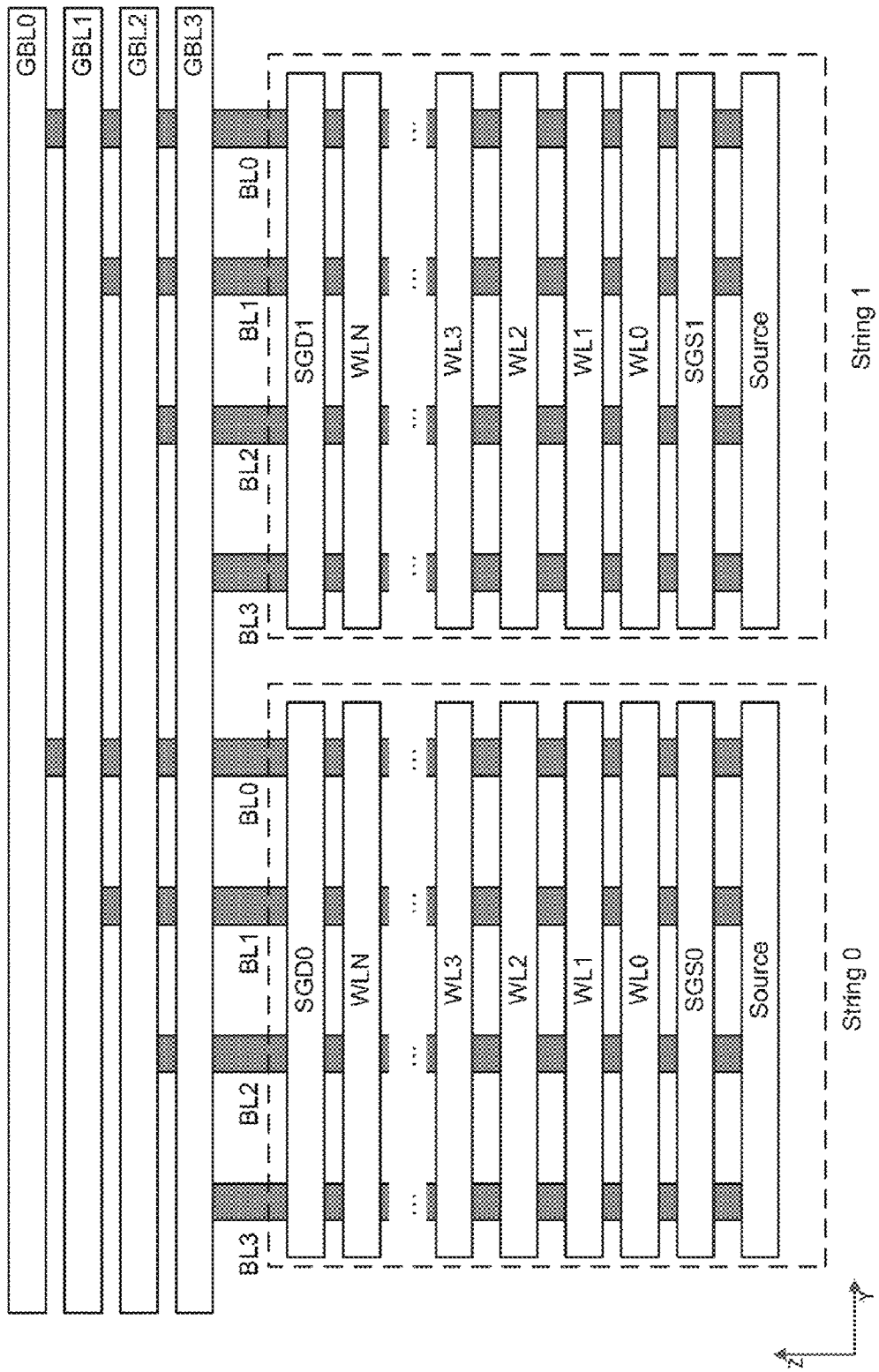
FIG. 10A is a cross-sectional view along the bit line direction (along the y-direction) of an example memory structure in which straight vertical NAND strings extend from common source connections in or near a substrate to global bit lines that extend over physical levels of memory cells.

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0 GBL3, and that these bit lines extend further in the y-direction and may connect with additional NAND strings in the block and in other blocks. Furthermore, additional bit lines extend parallel to GBL0 GBL3 (e.g. at different locations along x-axis, in front of, or behind the location of the cross-section of FIG. 10A).

Figure 10B:
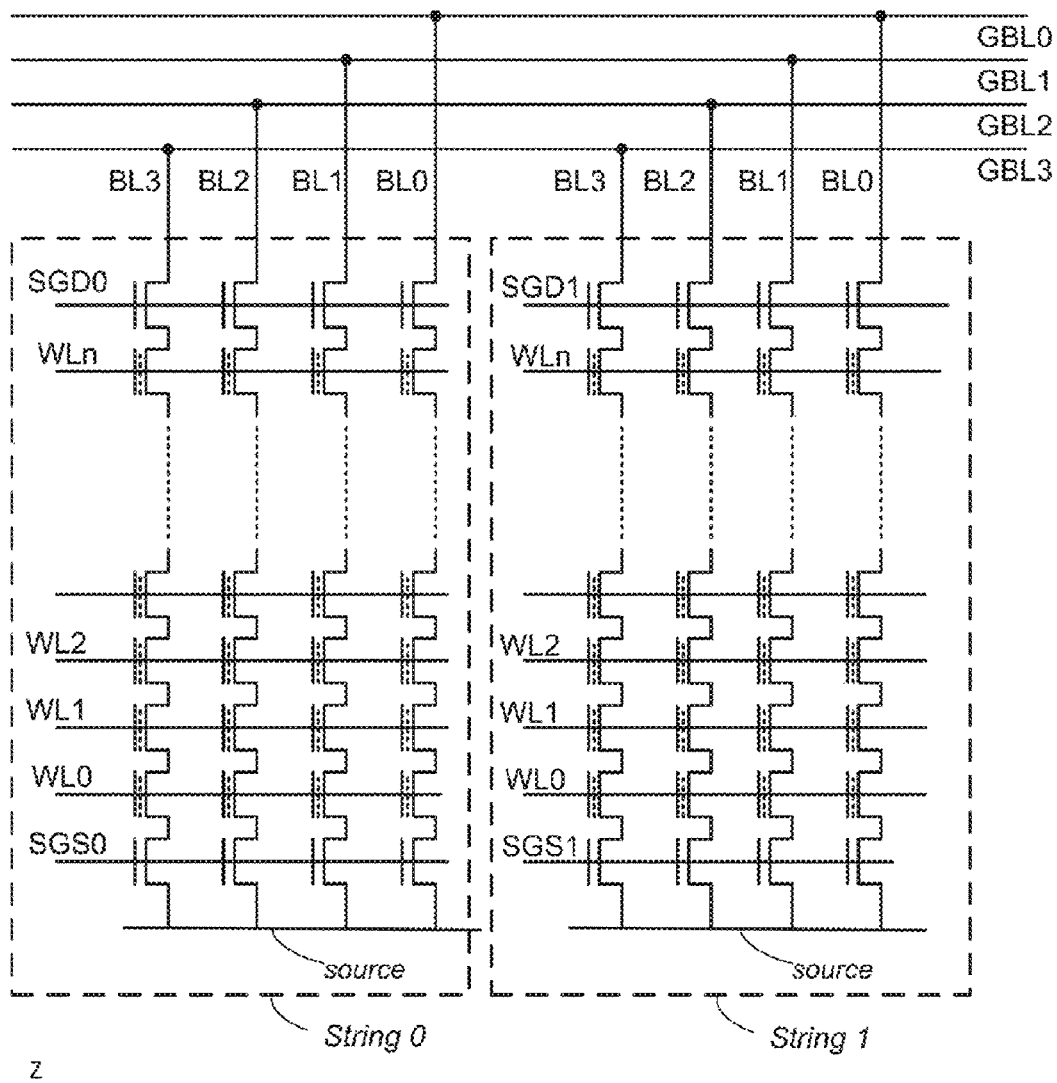
FIG. 10B is a circuit diagram of separately-selectable sets of NAND strings of FIG. 10A.

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 10C:
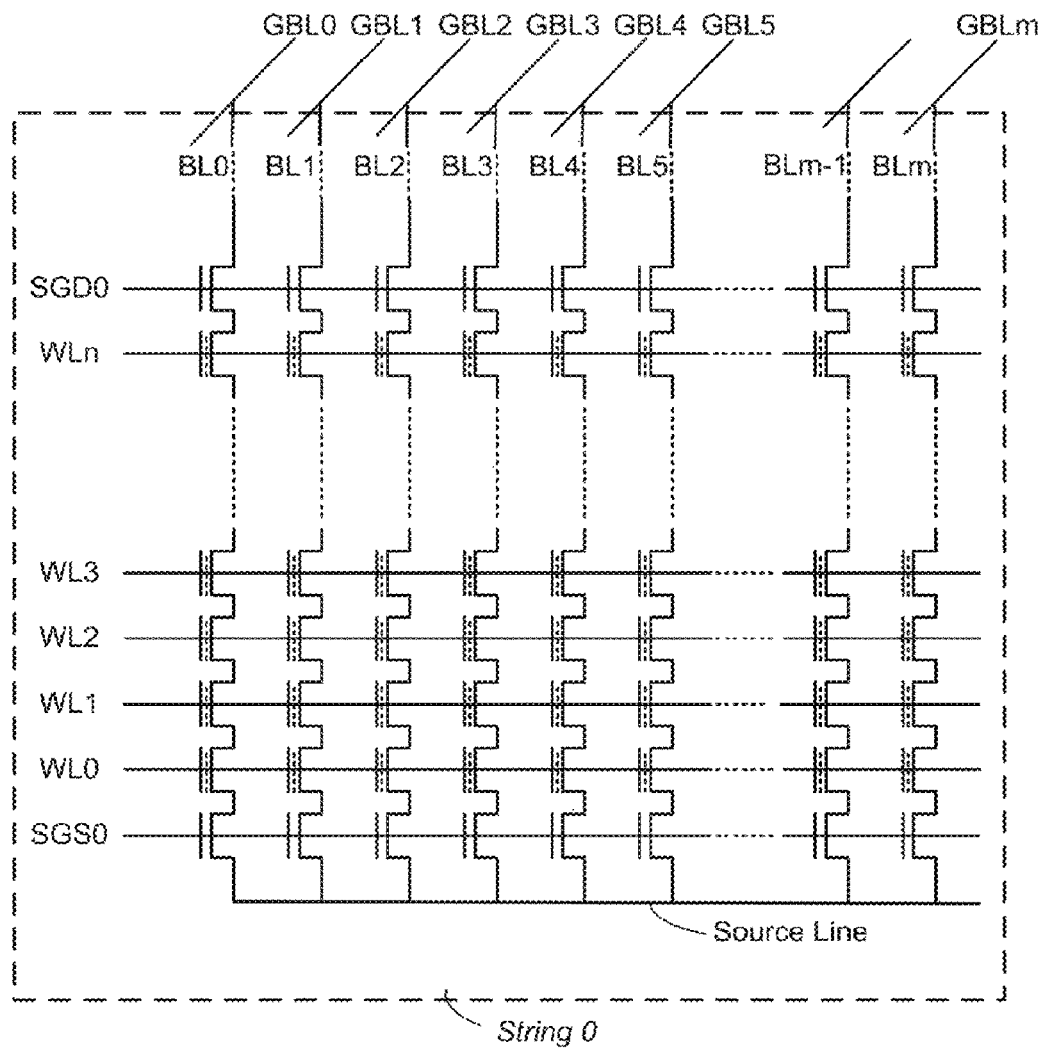
FIG. 10C is a circuit diagram of a separately selectable set of NAND strings in cross section along the x-z plane.

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming a page of memory cells in parallel.

The memory die 104 may also include a row address decoder 148 and a column address decoder 150. The row address decoder 148 may decode a row address and select a particular word line in the memory array 142 when reading or writing data to/from the memory cells 142. The column address decoder 150 may decode a column address to select a particular group of bitlines in the memory array 142 to read/write circuits 144.

In addition, the non-volatile memory die 104 may include peripheral circuitry 152. The peripheral circuitry 152 may include control logic circuitry 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including voltages (including program voltage pulses) to the wordlines, erase voltages (including erase voltage pulses), the source select gate bias voltage $V_{SSG}$ to the source select gate bias line SSG, the drain select gate bias voltage $V_{DSG}$ to the drain select gate bias line DSG, a cell source voltage $V_{celsrc}$ on the source lines SL, as well as other voltages that may be supplied to the memory array 142, the read/write circuits 144, including the sense blocks 146, and/or other circuit components on the memory die 104. The various voltages that are supplied by the power control circuitry 160 are described in further detail below. The power control circuitry 160 may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations.

In order to program a target memory cell, and in particular a FGT, the power control circuitry 160 applies a program voltage to the control gate of the memory cell, and the bit line that is connected to the target memory cell is grounded, which in turn causes electrons from the channel to be injected into the floating gate. During a program operation, the bit line that is connected to the target memory cell is referred to as a selected bit line. Conversely, a bit line that is not connected to a target memory cell during a program operation is referred to as an unselected bit line. In this context, a state of the bit line may refer to whether the bit line is selected or unselected. Otherwise stated, a bit line can be in one of two states, selected or unselected. When electrons accumulate in the floating gate, the floating gate becomes negatively charged and the threshold voltage $V_{TH}$ of the memory cell is raised. The power control circuitry 160 applies the program voltage $V_{PGM}$ on the wordline that is connected to the target memory cell in order for the control gate of the target memory cell to receive the program voltage $V_{PGM}$ and for the memory cell to be programmed. As previously described, in a block, one memory cell in each of the NAND strings share the same word line. During a program operation, the word line that is connected to a target memory cell is referred to as a selected word line. Conversely, a word line that is not connected to a target memory cell during a program operation is referred to as an unselected word line.

Figure 11A:
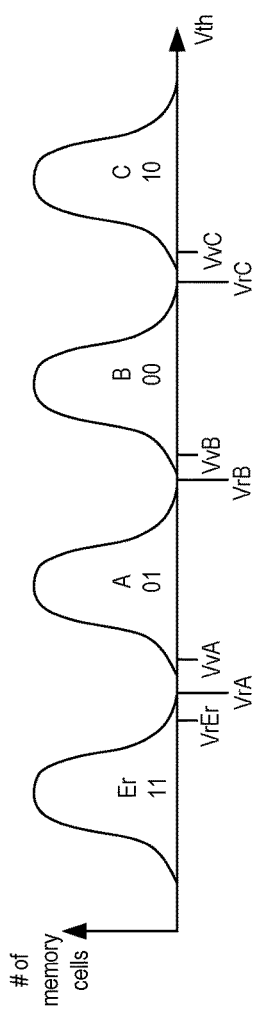
FIG. 11A is a plot of threshold voltage distribution curves for memory cells storing two bits of data.
Figure 11B:
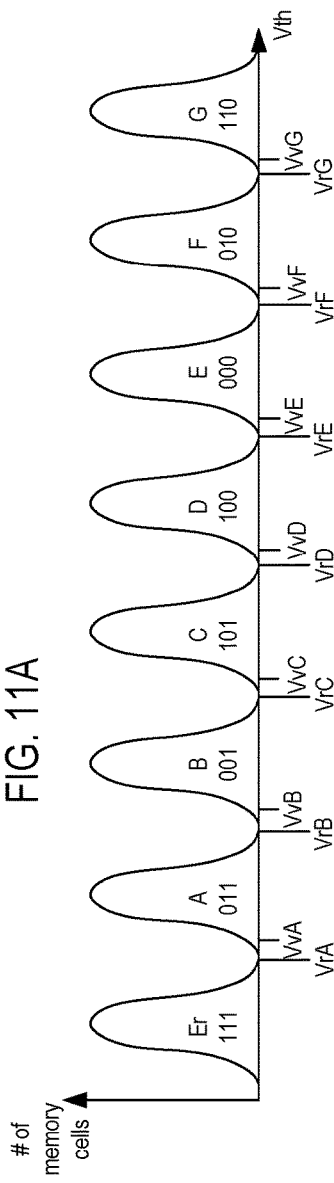
FIG. 11B is a plot of threshold voltage distribution curves for memory cells storing three bits of data.
Figure 11C:
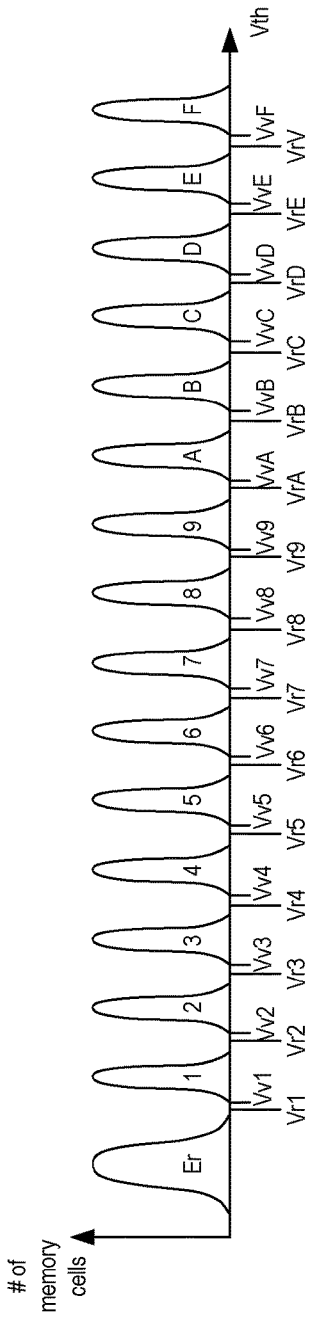
FIG. 11C is a plot of threshold voltage distribution curves for memory cells storing four bits of data.

FIGS. 11A-11C are plots of threshold voltage distribution curves for different numbers of bits being stored the memory cells. The threshold voltage distribution curves are plotted for threshold voltage $V_{TH}$ as a function of the number of memory cells. FIG. 11A show threshold voltage distribution curves for memory cells programmed to store two bits of data, FIG. 11B show threshold voltage distribution curves for memory cells programmed to store three bits of data, and FIG. 11C show voltage distribution curves for memory cells programmed to store four bits of data. Similar threshold voltage distribution curves may be generated for memory cells programmed to store numbers of bits other than two, three, and four.

At a given point in time, each memory cell may be a particular one of a plurality of memory states (otherwise referred to as a data state). The memory states may include an erased stated and a plurality of programmed states. Accordingly, at a given point in time, each memory cell may be in the erased state or one of the plurality of programmed states. The number of programmed states corresponds to the number of bits the memory cells are programmed to store. With reference to FIG. 11A, for a memory cell programmed to store two bits, the memory cell may be in an erased state Er or one of three programmed states A, B, C. With reference to FIG. 11B, for a memory cell programmed to store three bits, the memory cell may be in an erased state Er or one of seven programmed states A, B, C, D, E, F, G. With reference to FIG. 11C, for a memory cell programmed to store four bits, the memory cell may be in an erased state Er or one of fifteen programmed states 1, 2, 3, 4, 5, 6, 7, 8, 9, A, B, C, D, E, F. As shown in FIGS. 11A-11C, each voltage distribution curve is associated with the erased state or one of the programmed states.

Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage $V_{TH}$ a memory cell has allows the data (i.e., the logic values of the bits) that the memory cell is storing to be determined. The specific relationship between the data programmed into the memory cells and the threshold voltage levels of the memory cell depends on the data encoding scheme used for programming the memory cells. In one example, as shown in FIGS. 11A and 11B, a Gray code scheme is used to assign data values to the threshold voltage distribution curves. Under this scheme, for memory cells programmed with two bits of data, the data value "11" is assigned to the range of threshold voltages associated with the erased state Er, the data value "01" is assigned to the range of threshold voltages associated with programmed state A, the data value "00" is assigned to the range of threshold voltages associated with programmed state B, and the data value "10" is assigned to the range of threshold voltages associated with the programmed state C. Similar relationships between data values and memory states can be made for memory cells programmed to store three bits, four bits, or other bits of data.

Prior to performance of a program operation that programs a plurality or group of target memory cells, all of the memory cells of the group subjected to and/or selected to be programmed in the programming operation may be in the erased state. During the programming operation, the power control circuitry 160 may apply the program voltage to a selected word line and in turn the control gates of the target memory cells as a series of program voltage pulses. The target memory cells being programmed concurrently are connected to the same, selected word line. In many programming operations, the power control circuitry 160 increases the magnitude of the program pulses with each successive pulse by a predetermined step size. Also, as described in further detail below, the power control circuitry 160 may apply one or more verify pulses to the control gate of the target memory cell in between program pulses as part of a program loop or a program-verify operation. Additionally, during a programming operation, the power control circuitry 160 may apply one or more boosting voltages to the unselected word lines.

The target memory cells connected to the selected word line will concurrently have their threshold voltage change, unless they have been locked out from programming. When the programming operation is complete for one of the target memory cells, the target memory cell is locked out from further programming while the programming operation continues for the other target memory cells in subsequent program loops. Also, for some example programming operations, the control logic circuitry 154 may maintain a counter that counts the program pulses.

During a program operation to program a group of target memory cells, each target memory cell is assigned to one of the plurality of memory states according to write data that is to be programmed into the target memory cells during the program operation. Based on its assigned memory state, a given target memory cell will either remain the erased state or be programmed to a programmed state different from the erased state. When the control logic 154 receives a program command from the controller 102, or otherwise determines to perform a program operation, the write data in stored in latches included in the read/write circuitry 144. During the programming operation, the read/write circuitry 144 can read the write data to determine the respective memory state to which each of the target memory cells is to be programmed.

As described in further detail below, and as illustrated in FIGS. 11A-11C, each programmed state is associated with a respective verify voltage level $V_V$. A given target memory cell is programmed in its assigned memory state when its threshold voltage $V_{TH}$ is above the verify voltage $V_V$ associated with the memory state assigned to that target memory cell. As long as the threshold voltage $V_{TH}$ of the given target memory cell is below the associated verify voltage $V_V$, the control gate of the target memory cell may be subject to a program pulse to increase the target memory cell's threshold voltage $V_{TH}$ to within the threshold voltage range associated with the memory state assigned to the given target memory cell. Alternatively, when the threshold voltage $V_{TH}$ of the given target memory cell increases to above the associated verify voltage level $V_V$, then programming may be complete for the given target memory cell. As described in further detail below, a sense block 146 may participate in a program-verify operation that determines whether programming for a given memory cell is complete.

As previously mentioned, target memory cells subject to a program operation may also be subject to a verify operation that determines when programming is complete for each of the target memory cells. The verify operation is done in between program pulses, and so the programming operation and the verify operation in performed in an alternating or looped manner. The combination of the programming operation and the verify operation is called a program-verify operation. Accordingly, a program-verify operation includes a plurality of programming operations and a plurality of verify operations that are alternatingly performed. That is, a program-verify operation involves a programming operation followed by a verify operation, followed by another programming operation, followed by another verify operation, and so on until the program-verify operation has no more programming or verify operations to be performed. In addition, a single programming operation of a program-verify operation includes the power control circuitry 160 supplying one or more program pulses to the selected word line for that single programming operation, and a single verify operation of a program-verify operation includes the power control circuitry 160 supplying one or more verify pulses to the selected word line for that single programming operation. Accordingly, a program-verify operation may include the power control circuitry 160 supplying a pulse train or a series of voltage pulses to the selected word line, where the pulse train includes one or more program pulses followed by one or more verify pulses, followed by one or more program pulses, followed by one or more verify pulses, and so on until the program-verify process has no more program or verify pulses for the power control circuitry 160 supply to the selected word line.

A program-verify operation is complete when the verify portion of the program-verify operation identifies that all of the memory cells have been programmed to their assigned threshold voltages $V_{TH}$. As mentioned, the verify process verifies or determines that a given target memory cell is finished being programmed when the verify process determines that the target memory cell's threshold voltage has increased to above the verify voltage level $V_V$ associated with the memory state to which the target cell is to be programmed.

For some example program-verify operations, all of the target memory cells subject to a program-verify operation are not subject to a single verify operation at the same time. Alternatively, for a single verify operation, only those target memory cells that are assigned to the same memory state are subject to a verify operation. For a single verify operation, target memory cells that are subject to the single verify operation are called selected memory cells or selected target memory cells, and target memory cells that are not subject to the single verify operation are called unselected memory cells or unselected target memory cells. Likewise, for a group of bit lines connected to the target memory cells of a program-verify operation, bit lines connected to the selected memory cells for a single verify operation are called selected bit lines, and bit lines connected to the unselected memory cells for a single verify operation are called unselected bit lines. In this context, a state of the bit line may refer to whether the bit line is selected or unselected. Otherwise stated, a bit line connected to a target memory cell can be in one of two states, selected or unselected.

For each of the verify operations, the power control circuitry 160, or some combination of the power control circuitry 160, the read/write circuitry 144, and the sense blocks 146, may supply voltages at appropriate levels to the selected and unselected word lines and the selected and unselected bit lines in order for a verify operation to be performed for the selected memory cells of the target memory cells subject to the program-verify operation. For clarity, and unless otherwise specified, the combination of the power control circuitry 160, the read/write circuitry 144, and the sense blocks 146 used to bias the selected and unselected word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof.

For performance of a verify operation in a block, the voltage supply circuitry may supply a drain select gate bias voltage $V_{SGD}$ on the drain select gate bias line SGD to the control gates of the drain select gate transistors (such as those shown in FIGS. 6-10C) and a source select gate bias voltage $V_{SGS}$ on the source select gate bias line SGS to the control gates of the drain select gate transistors (such as those shown in FIGS. 6-10C) at levels that turn on the drain select gate transistors and the source select gate transistors in response to the voltage supply circuitry supplying voltages at suitable levels on the common source line SL and to the bit lines.

Additionally, the voltage supply circuitry supplies a source line voltage at a cell source voltage level Vcelsrc, otherwise referred to as the cell source voltage Vcelsrc, on the common source line SL. Further, the voltage supply circuitry biases the drain side of the selected bit lines with a high supply voltage VHSA that is higher in magnitude than the cell source voltage Vcelsrc. The difference between the high supply voltage VHSA and the cell source voltage level Vcelsrc may be great enough to allow current to flow from the drain side to the source side of a string that includes a selected target memory cell in the event that the selected target memory cell has a threshold voltage $V_{TH}$ that allows it to conduct a current. During a verify operation, a selected memory cell can be generally characterized as fully conducting, marginally conducting, or non-conducting, depending on the threshold voltage $V_{TH}$ of the selected memory cell. Also, the voltage supply circuitry biases the drain side of the unselected bit lines to the cell source voltage Vcelsrc. By biasing the drain side and the source side of unselected bit lines to the cell source voltage Vcelsrc, the voltage difference between the drain side and source side voltages will not allow current to flow through the NAND string connected to the unselected bit line. Further, the voltage supply circuitry biases the unselected word lines, and in turn the control gates of FGTs coupled to the unselected word lines, to a read voltage Vread. The read voltage is high enough to cause the FGTs coupled to unselected word lines to conduct a current regardless of its threshold voltage $V_{TH}$. In addition, the voltage supply circuitry biases the selected word line with a control gate reference voltage $V_{CGRV}$, which may be in the form of one or more verify pulses as previously described. The control gate reference voltage $V_{CGRV}$ may be different for verification of target memory cells of different memory states. For example, the voltage supply circuitry may supply a different control gate reference voltage $V_{CGRV}$ (or a control gate reference voltage $V_{CGRV}$ at different level) when verifying target memory cells programmed to state A than when verifying target memory cells programmed to state B, and so on.

Once the voltage supply circuitry supplies the voltages to the selected and unselected word lines and bit lines, and to the drain select gate transistors, source select gate transistors, drain select gate bias line SGD, and source select gate bias line SGS, a sense block can perform a sense operation that identifies whether a selected target memory cell is conducting, and in turn sufficiently programmed. Further details of the sense operation portion of the verify operation are described in further detail below.

As previously described, the threshold voltage $V_{TH}$ of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks 146 may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage $V_{TH}$ of the target memory cells. For some configurations, the level of the voltage supplied to the selected word lines may vary depending on the states of the memory cells.

The voltage supply circuitry may also bias the bit lines so that the high supply voltage VHSA is applied to the drain side of the bit lines and the cell source voltage Vcelsrc is applied to the source side of the bit lines to allow for the current flow, provided that the threshold voltage $V_{TH}$ of the selected memory cell allows for it. For some example read configurations, the sense block 146 can perform a sense operation for fewer than all of the memory cells of a page. For such configurations, the target memory cells of the page that are subject to and/or that are selected for a given sense operation are referred to as selected memory cells or selected target memory cells. Conversely, the target memory cells of the page that are not subject to and/or that are not selected for the sense operation are referred to as unselected memory cells. Accordingly, bit lines connected to selected target memory cells are referred to as selected bit lines, and bit lines connected to unselected target memory cells are referred to as unselected bit lines. In this context, a state of the bit line may refer to whether the bit line is selected or unselected. Otherwise stated, a bit line can be in one of two states, selected or unselected. The voltage supply circuitry can supply the voltages to the selected and unselected word lines and the selected and unselected bit lines at levels in various combinations, in various sequences, and/or over various sense operations in order determine the threshold voltages of the target memory cells so that the data values of the data that the target memory cells are storing can be determined.

Figure 12:
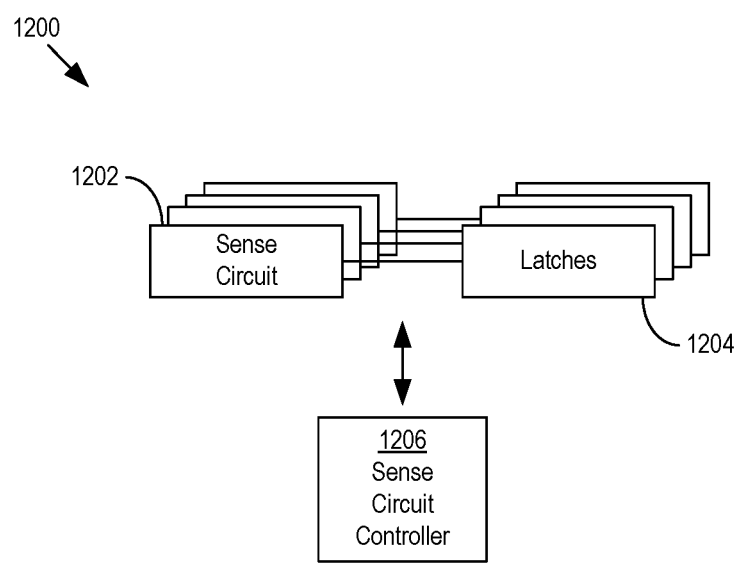
FIG. 12 is a block diagram of an example configuration of a sense block of FIG. 2B.

FIG. 12 is a block diagram of an example configuration of a sense block 1200, which may be representative of one of the sense blocks 146(1) to 146(p) of FIG. 2B. The sense block 1200 may include a plurality of sense circuits 1202 and a plurality of sets of latches 1204. Each sense circuit (also referred to as a sense amplifier circuit) 1202 may be associated with a respective one of the latches 1204. That is, each sense circuit 1202 may be configured to communicate with and/or perform a sense operation using data and/or storing data into its associated latches set 1204. Additionally, the sense block 1200 may include a sense circuit controller 1206 that is configured to control operation of the sense circuits 1202 and the sets of latches 1204 of the sense block 1200. As described in further detail below, the sense circuit controller 106 may control operation of the sense circuits 1202 and the latches 1204 by outputting control signals to terminals of the sense circuits 1202 and the latches 1204. Additionally, the sense circuit controller 1206 may communicate with and/or may be a part of the control logic 154. The sense circuit controller 1206 may be implemented in hardware, or a combination of hardware and software. For example, the sense circuit controller 1206 may include a processor that executes computer instructions stored in memory to perform at least some of its functions.

Figure 13:
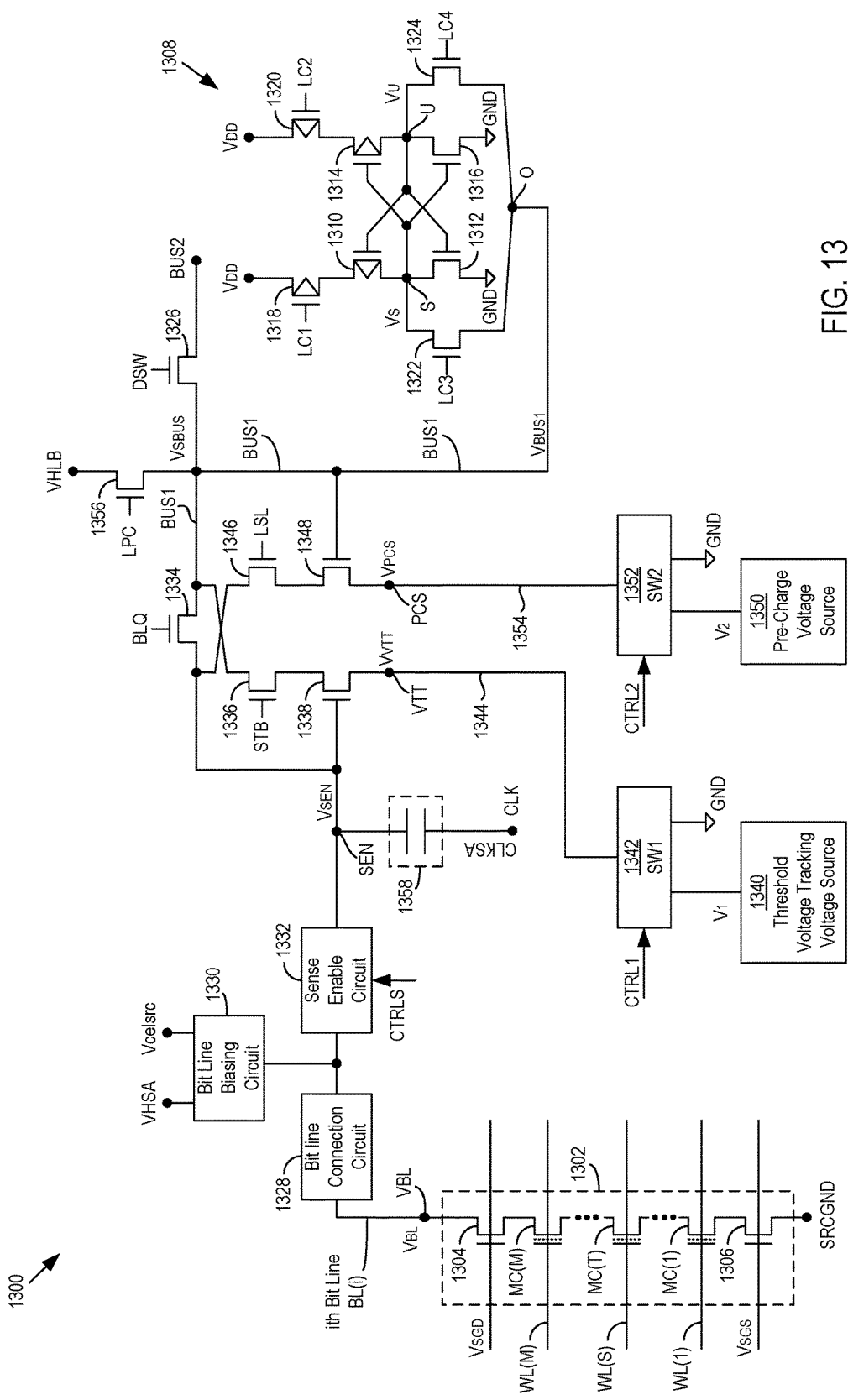
FIG. 13 is a block diagram of an example configuration of a sense circuit of the sense block of FIG. 12.

FIG. 13 is a circuit schematic of an example sense circuit 1300 that may be representative of one of the sense circuits 1202 of the sense block 1200 of FIG. 12, and/or included in one of the sense blocks 146 of FIG. 2B. In addition, the sense circuit 1300 is coupled to and configured to sense current drawn through an associated ith bit line BL(i). As described in further detail below, the sense circuit 1300 includes a pre-charge circuit path that is configured to pre-charge a sense node with a voltage at a pre-charge voltage level during a pre-charge period of a sense operation. The sense circuit 1300 may be configured to pre-charge the sense node in a state-dependent manner. In particular, in response to the ith bit line BL(i) being a selected bit line, the sense circuit 1300 is configured to enable or allow the pre-charge circuit path to pre-charge the sense node during the pre-charge period. Alternatively, in response to the ith bit line BL(i) being an unselected bit line, the sense circuit 1300 is configured to disable the pre-charge circuit path in order to prevent the pre-charge circuit path from pre-charging the sense node during the pre-charge period. The state-dependent pre-charge operation is described in further detail below.

In FIG. 13, the ith bit line BL(i) is connected to an associated NAND string 1302. The ith bit line BL(i) may be one of a plurality bit lines and the NAND string 1302 may be one of a plurality of NAND strings included in a memory cell structure 142 of one of the memory dies 104. The NAND string 1302 includes an M-number of memory cells MC(1) to MC(M). For purposes of illustration, one of the memory cells MC(1) to MC(M) is identified as being a target memory cell MC(T). For a read operation, the target memory cell MC(T) is a memory cell from which data is to be read and thus, for which a sense operation is performed. For a verification operation, the target memory cell MC(T) is a memory cell being programmed in an associated program-verify operation. FIG. 13 shows the target memory cell MC(T) connected to a selected word line WL(S). FIG. 13 also shows the NAND string 1302 including, on its drain side, a drain select gate transistor 1304 configured to receive a drain select gate voltage $V_{SGD}$ at its control gate, and including, on its source side, a source select gate transistor 1306 configured to receive a source select gate voltage $V_{SGS}$ at its control gate. FIG. 13 also shows the ith bit line BL(i) and associated NAND string 1302 connected to a bit line bias node $V_{BL}$ on its drain side, where the ith bit line is configured to be biased with a bit line bias voltage $V_{BL}$. In addition, the ith bit line BL(i) is connected to a source ground node SRCGND, which is connected to an associated source line SL. As described in further detail below, the source ground node SRCGND may be biased with the cell source voltage Vcelsrc.

In addition, the sense circuit 1300 is connected to and/or in communication with a latch 1308, which, for at least some example configurations, may be representative of a plurality or collection of latches that the sense circuit 1300 communicates with to perform sense operations. For example, other latches may include data latches configured to store data that is to be programmed into the target memory cell MC(T) or data that is sensed from the target memory cell MC(T). For clarity, the sense circuit 1300, the ith bit line BL(i), the NAND string 1302 connected to the ith bit line BL(i), and the latch 1308 are be referred to as all being associated with each other. Accordingly, reference to the latch 1308 being associated with the ith bit line BL(i) means that the latch 1308 is connected to the same sense circuit 1300 as the ith bit line BL(i).

The latch 1308, which can also be referred to as a latch circuit, an auxiliary latch or an auxiliary latch circuit, may be configured to generate and output a select voltage Vs at a select node S and an unselect voltage $V_U$ at an unselect node U. The latch 1308 may be configured to generate each of the select voltage Vs and the unselect voltage $V_U$ at an associated high voltage level or an associated low voltage level. The select and unselect voltages $V_S$, $V_U$ may be inverses of each other, meaning that when the latch 1308 generates one at an associated high voltage level, it generates the other at an associated low voltage level.

FIG. 13 shows an example circuit configuration of the latch 1308. In the example circuit configuration, the latch 1308 includes a pair of cross-coupled inverters, including a first inverter and a second inverter. The first inverter includes a first p-channel metal-oxide-semiconductor field-effect transistor (PMOS transistor) 1310 and a first n-channel metal-oxide-semiconductor field-effect transistor (NMOS transistor) 1312. The drain terminals of the first PMOS transistor 1310 and the first NMOS transistor 1312 are connected or tied together at the select node S, and the gate terminals of the first PMOS transistor 1310 and the first NMOS transistor 1312 are connected or tied together at the unselect node U. The input of the first inverter is the unselect node U where the gate terminals of the first NMOS and PMOS transistors 1310, 1312 are connected to each other, and the output of the first inverter is the select node S where the drain terminals of the first NMOS and PMOS transistors 1310, 1312 are connected to each other. Accordingly, the input voltage of the first inverter is the unselect voltage $V_U$ and the output voltage of the first inverter is the select voltage $V_S$. Similarly, the second inverter includes a second PMOS transistor 1314 and a second NMOS transistor 1316. The drain terminals of the second PMOS transistor 1314 and the second NMOS transistor 1316 are connected or tied together at the unselect node U, and the gate terminals of the second PMOS transistor 1314 and the second NMOS transistor 1316 are connected or tied together at the select node S. The input of second inverter is the select node S where the gate terminals of the second NMOS and PMOS transistors 1314, 1316 are connected to each other, and the output of the second inverter is the unselect node U where the drain terminals of the second NMOS and PMOS transistors 1314, 1316 are connected to each other. Accordingly, the input voltage of the second inverter is the select voltage $V_S$ and the output voltage of the second inverter is the unselect voltage $V_U$.

The latch 1308 is connected to the sense circuit 1300 via a first communications bus BUS1. In particular, the latch 1308 may include an output node O connected to the first bus BUS1. A first bus (BUS1) voltage $V_{BUS1}$ may be generated on the first bus BUS1.

In addition, the latch 1308 may be configured to operate in two modes, including a write mode and a read mode. In the write mode, the latch 1308 may be configured to perform a latch write operation in which the latch 1308 is configured to set the level of the select voltage $V_S$ or the level of the unselect voltage $V_U$ be equal to or to correspond to the voltage level of the BUS1 voltage $V_{BUS1}$. In the read mode, the latch 1308 is configured to perform a read operation in which the latch 1308 is configured to set the voltage of the first bus BUS1 to a level corresponding to the level of the select voltage $V_S$ or to the level of the unselect voltage $V_U$. In situations where the levels of the BUS1 voltage $V_{BUS1}$, the select voltage $V_S$, and the unselect voltage $V_U$ correspond to or represent logic levels of data bits, in the write mode, the latch 1308 may be considered to write a data bit on the first bus BUS1 into the latch 1308 in the write mode, and to read a data bit from the latch 1308 onto the first bus BUS1 in the read mode.

The latch 1308 may further include a plurality of latch control (LC) transistors that are configured to control the latch 1308 to perform latch write operations in the write mode and latch read operations in the read mode. The plurality of latch control transistors includes an LC1 transistor 1318, and LC2 transistor 1320, an LC3 transistor 1322, and a LC4 transistor 1324. The LC1 transistor 1318 has a gate terminal configured to receive a LC1 control signal, a source terminal configured to receive a source voltage $V_{DD}$, and a drain terminal connected to the source terminal of the first PMOS transistor 1310 of the first inverter. The LC1 transistor 1318 forms a first series-connected circuit path with the first PMOS and NMOS transistors 1310, 1312, with the first NMOS transistor 1312 having its source terminal connected to a ground reference GND. The LC2 transistor 1320 has a gate terminal configured to receive a LC2 control signal, a source terminal configured to receive the source voltage $V_{DD}$, and a drain terminal connected to the source terminal of the second PMOS transistor 1314 of the second inverter. The LC2 transistor 1320 forms a second series-connected circuit path with the second PMOS and NMOS transistors 1314, 1316, with the second NMOS transistor 1316 having its source terminal connected to the ground reference GND. The LC3 transistor 1322 has a gate terminal configured to receive an LC3 control signal, a source terminal connected to the select node S, and a drain terminal connected to the output node O. The LC4 transistor 1324 that has a gate terminal configured to receive an LC4 control signal, a source terminal connected to the unselect node U, and a drain terminal connected to the output node O.

Collectively, the LC1 control signal, the LC2 control signal, the LC3 control signal, and the LC4 control signal may be referred to as latch control (LC) signals. The sense circuit controller 1206 may be configured to output the latch control signals to control the operation of the latch 1308. In particular, the sense circuit controller 1206 may be configured to generate each of the LC1 control signal, the LC2 control signal, the LC3 control signal, and the LC4 control signal at respective high voltage levels and low voltage levels to turn on and off the respective LC1 transistor 1318, the LC2 transistor 1320, the LC3 transistor 1322, and the LC4 transistor '1324 at certain times and/or in accordance with a sequence during the read and write modes. In general, and unless specified otherwise, a high voltage level of a control signal that is applied to a gate terminal of a transistor is a voltage level that is capable of turning on an NMOS transistor and turning off a PMOS transistor, and a low voltage level of a control signal that is applied to a gate terminal of a transistor is a voltage level that is capable of turning off an NMOS transistor and turning on a PMOS transistor.

During certain periods of operation, including but not limited to periods of operation in the read and write modes, the sense circuit controller 1206 may be configured to configure the latch 1308 in a steady state mode of operation (or just steady state). In the steady state mode of operation, the latch 1308 may be configured to maintain the select and unselect voltages $V_S$, $V_U$ at their respective low voltage levels. The sense circuit controller 1206 may be configured to output each of the latch control signals at their respective low voltage levels to configure the latch 1308 in the steady state. The LC1 transistor 1318 and the LC2 transistor 1320 will each turn on in response to respective receipt of the LC1 control signal and the LC2 control signal at their low voltage levels. Additionally, the LC3 transistor 1322 and the LC4 transistor 1324 will each turn off in response to respective receipt of the LC3 control signal and the LC4 control signal at their low voltage levels.

The sense circuit controller 1206 may be configured to control the latch 1308 to perform a latch write operation in the write mode to set the voltage levels of the select and unselect voltages $V_S$, $V_U$ at the start of a sense operation. In particular, the sense circuit controller 1206 may be configured to output the latch control signals to cause the latch 1308 to generate and output the select voltage $V_S$ at its high voltage level and the unselect voltage $V_U$ at its low voltage level, or to generate and output the select voltage $V_S$ at its low voltage level and the unselect voltage $V_U$ at its high voltage level for the sense operation.

For performance of a given sense operation, whether the sense circuit controller 1206 configures the latch 1308 to generate the select voltage $V_S$ at its high voltage level and the unselect voltage $V_U$ at its low voltage level, or to generate the select voltage $V_S$ at its low voltage level and the unselect voltage $V_U$ at its high voltage level may depend on whether the ith bit line BL(i) is a selected bit line or an unselected bit line for the sense operation. In particular, for the sense operation, if the sense circuit controller 1206 determines that the ith bit line BL(i) is a selected bit line, then the sense circuit controller 1206 may output the latch control signals to cause the latch 1308 to perform a latch write operation by generating and outputting the select voltage $V_S$ at its high voltage level and the unselect voltage $V_U$ at its low voltage level. Alternatively, if the sense circuit controller 1206 determines that the ith bit line BL(i) is an unselected bit line, then the sense circuit controller 1206 may output the latch control signals to cause the latch 1308 perform a latch write operation by generating and outputting the select voltage $V_S$ at its low voltage level and the unselect voltage $V_U$ at its high voltage level.

In a particular example latch write operation for a sense operation, the sense circuit controller 1206 may control the sense circuit 1300 so that the BUS1 voltage $V_{BUS1}$ is at a low voltage level, and may configure the latch 1308 in the steady state, such as by outputting each of the latch control signals at their respective low voltage levels. The sense circuit controller 1206 may then set the voltage levels of the select voltage $V_S$ and the unselect voltage $V_U$ at their respective high or low voltage levels according to a sequence of toggling the latch control signals between their high and low voltage levels over two periods of time, including a first period referred to as reset period and a second period referred to as a set period. The two periods may be sub-periods of a larger period of time referred to as a scan period. In other words, the sense circuit controller 1206 and the latch 1308 may perform a latch write operation during a scan period that includes a reset period (or sub-period) followed by a set period (or sub-period). During the reset period, the sense circuit controller 1206 resets the latch 1308 so that the latch 1308 generates the select voltage $V_S$ at its high voltage level and the unselect voltage $V_U$ at its low voltage level. During the set period, the sense circuit controller 1206 controls the latch 1308 to set the select and unselect voltages $V_S$, $V_U$ to voltage levels that correspond to whether the ith bit line BL(i) is a selected bit line or an unselected bit line.

In further detail, during the reset period, the sense circuit controller 1206 configures the latch 1308 in a reset state. In the reset state, the latch 1308 is configured to generate the select voltage $V_S$ at the high voltage level and the unselect voltage $V_U$ at the low level. The sense circuit controller 1206 may be configured to configure the latch 1308 in the reset state regardless of whether the ith bit line BL(i) is a selected bit line or an unselected bit line for the sense operation. At a first time in the reset period, the sense circuit controller 1206 may transition the LC2 control signal from its low voltage level to its high voltage level while keeping the other latch control signals at their low voltage levels. The LC2 transistor 1320 may respond to the transition by turning off. At a second time in the reset period, the sense circuit controller 1206 may transition the LC4 control signal from its low voltage level to its high voltage level, such that the LC2 and LC4 control signals are at their high voltage levels, while the LC1 and LC3 control signals are still at their low voltage levels. The LC4 transistor 1324 may respond to the LC4 control signal by transitioning to its high voltage level by turning on.

Turning on the LC4 transistor 1324, in combination with the BUS1 voltage $V_{BUS1}$ set to its associated low voltage level, may cause the unselect voltage $V_U$ to be set to its associated low voltage level. If, prior to the latch write operation, the unselect voltage $V_U$ was already at its low voltage level, then turning on the LC4 transistor 1324 at the second time may cause the latch 1308 to keep the unselect voltage $V_U$ at its low voltage level. Alternatively, if prior to the latch write operation, the unselect voltage $V_U$ was as its high voltage level, then turning on the LC4 transistor 1324 at the second time may pull down the unselect voltage $V_U$ from its high voltage level to its low voltage level. In either situation, turning on the LC4 transistor 1324 at the second time may cause the latch 1308 to set the unselect voltage $V_U$ to its low voltage level. In response to unselect voltage $V_U$ being set to the low level, the cross-coupled inverters may set the select voltage $V_S$ to its associated high voltage level. That is, if, prior to the latch write operation, the select voltage $V_S$ was already at its high voltage level, then turning on the LC4 transistor 1324 may cause the latch 1308 to keep the select voltage $V_S$ at its high voltage level. Alternatively, if prior to the latch write operation, the select voltage $V_S$ is at its low voltage level, then turning on the LC4 transistor 1324 may cause the latch 1308 to pull up the select voltage $V_S$ to its high voltage level.

At a third time following the second time, the sense circuit controller 1206 may pull down both LC2 control signal and the LC4 control signal to configure the latch 1308 back into its steady state. In response, the latch 1308 may maintain the select voltage $V_S$ at its high voltage level and the unselect voltage $V_U$ at its low voltage level.

The resetting of the latch 1308 during the reset period may be a global operation, meaning that all of the latches that are part of sense blocks (e.g., sense blocks 146 in FIG. 2B or sense block 1200 in FIG. 12) involved in a sense operation may be reset by the sense circuit controllers 1206 during the reset period of the latch write operation, such that they each generate their respective select voltages $V_S$ at their high voltage levels and their unselect voltages $V_U$ at their low voltage levels.

A fourth time following the third time may mark the start of the set period of the latch write operation. The sense circuit controller 1206 may know whether the ith bit line BL(i) is a selected bit line or an unselected bit line for the sense operation. Accordingly, if the sense circuit controller 1206 determines that the ith bit line BL(i) is a selected bit line for the sense operation, then the sense circuit controller 1206 may determine to maintain the latch 1308 in its steady state since the latch 1308 is already generating the select and unselect voltages $V_S$, $V_U$ at voltage levels corresponding to the ith bit line being a selected bit line (i.e., the select voltage $V_S$ is at its high voltage level, and the unselect voltage is at its low voltage level).

Alternatively, if the sense circuit controller 1206 determines that the ith bit line BL(i) is an unselected bit line for the next sense operation, then the sense circuit controller 1206 may determine that the latch 1308 is to change or switch the voltage levels at which it is generating the select and unselect voltages $V_S$, $V_U$. That is, the sense circuit controller 1206 may determine that the latch 1308 is to change the voltage level at which it is generating the select voltage $V_S$ from the high voltage level to the low voltage level, and to change the voltage level at which it is generating the unselect voltage $V_U$ from the low voltage level to the high voltage level. To do so, at the fourth time, the sense controller 1206 may transition the LC1 control signal from its low voltage level to its high voltage level, while keeping the other latch control signals at their respective low voltage levels. The LC1 transistor 1318 may respond to the transition of the LC1 control signal from the low voltage level to the high voltage level by turning off. At a fifth time following the fourth time, the sense controller 1206 may transition the LC3 control signal from its low voltage level to its high voltage level while keeping the LC1 control signal at its high voltage level and the LC2 and LC4 control signals each at their respective low voltage levels. The LC3 transistor 1322 may respond to the transition of the LC3 control signal from the low voltage level to the high voltage level by turning on.

Turning on the LC3 transistor 1322, in combination with the BUS1 voltage $V_{BUS1}$ set to its associated low voltage level, may cause the select voltage $V_S$ to be set to its associated low voltage level. In response to select voltage $V_S$ being set to the low level, the cross-coupled inverters may set the unselect voltage $V_U$ to its associated high voltage level. At a fifth time period, the sense circuit controller 1206 may transition both the LC1 control signal 1318 and the LC3 control signal 1322 to their respective low voltage levels, while maintaining the LC2 and LC4 control signals at their respective low voltage levels, in order to configure the latch 1308 back into its steady state. In its steady state, the latch 1308 may maintain the select voltage $V_S$ at its associated low voltage level and the unselect voltage $V_U$ at its associated high voltage level. The fifth time at which the sense circuit controller 1206 configures the latch 1308 back into its steady state may mark the end of the set period and the scan period as a whole.

Accordingly, for sense blocks involved in a sense operation, at the end of the set period, the latches 1308 that are associated with selected bit lines are configured to generate their respective select voltages $V_S$ at their high voltage levels and their respective unselect voltages $V_U$ at their low voltage levels, while the latches 1308 that are associated with unselected bit lines are configured to generates their respective select voltages $V_S$ at their low voltage levels and the respective unselect voltages $V_U$ at their high voltage levels.

In addition, the sense circuit controller 1206 may be configured to control the latch 1308 to perform a latch read operation in the read mode. When performing an read operation, the latch 1308 may set the voltage level of the BUS1 voltage $V_{BUS1}$ to a voltage level corresponding to a voltage level of the select voltage $V_S$ or a voltage level of the unselect voltage $V_U$. At the start of or immediately before the latch read operation, the sense circuit controller 1206 may configure the latch 1308 in the steady state. Then, if the sense circuit controller 1206 wants to set the voltage level of the BUS1 voltage $V_{BUS1}$ to correspond to the voltage level of the select voltage $V_S$, the sense circuit controller 1206 may transition the LC3 control signal from its low voltage level to its high voltage level to turn on the LC3 transistor 1322, while keeping the other latch control signals at their respective low voltage levels. Alternatively, if the sense circuit controller 1206 wants to set the voltage level of the BUS1 voltage $V_{BUS1}$ to correspond to the voltage level of the unselect voltage $V_U$, the sense circuit controller 1206 may transition the LC4 control signal from its low voltage level to its high voltage level to turn on the LC4 transistor 1324, while keeping the other latch control signals at their respective low voltage levels.

For some example configurations, the latch 1308 may be unable to perform a latch read operation to set the voltage level of the BUS1 voltage $V_{BUS1}$ to the high voltage level of the select voltage $V_S$ or the unselect voltage $V_U$. For example, if the select voltage $V_S$ is at its high voltage level, transitioning the LC3 control signal to its high voltage level may not turn on the LC3 transistor 1322 because the gate-to-source voltage of the LC3 transistor 1322 will not be great enough to turn on the LC3 transistor 1322. Accordingly, if the select voltage $V_S$ is at its high voltage level, when the sense circuit controller 1206 transitions the LC3 control signal to the high voltage level, the LC3 transistor 1322 may respond by staying turned off. In turn, the first bus BUS1 may remain floating relative to the select node S. As a result, the latch 1308 may not set the BUS1 voltage $V_{BUS1}$ to a level corresponding to the high voltage level of the select voltage $V_S$ in response to the sense circuit controller 1206 transitioning the LC3 signal to its high voltage level.

Similarly, if the unselect voltage $V_U$ is at its high voltage level, transitioning the LC4 control signal to its high voltage level may not turn on the LC4 transistor 1324 because the gate-to-source voltage of the LC4 transistor 1324 will not be great enough to turn on the LC4 transistor 1324. Accordingly, if the unselect voltage $V_U$ is at its high voltage level, when the sense circuit controller 1206 transitions the LC4 control signal to the high voltage level, the LC4 transistor 1324 may respond by staying turned off. In turn, the first bus BUS1 may remain floating relative to the unselect node U. As a result, the latch 1308 may not set the BUS1 voltage $V_{BUS1}$ to a level corresponding to the high voltage level of the unselect voltage $V_U$ in response to the sense circuit controller 1206 transitioning the LC4 signal to its high voltage level.

Alternatively, the latch 1308 may be able to perform a latch read operation by setting the voltage level of the BUS1 voltage $V_{BUS1}$ to the low voltage level of the select voltage $V_S$ or the unselect voltage $V_U$. That is, the latch 1308 may be able to set the voltage level of the BUS1 voltage $V_{BUS1}$ to correspond to the voltage level of the select voltage $V_S$ or the unselect voltage $V_U$ if that voltage level is the low voltage level. For example, if the select voltage $V_S$ is at its low voltage level, transitioning the LC3 control signal to its high voltage level may turn on the LC3 transistor 1322 because the gate-to-source voltage of the LC3 transistor 1322 will be great enough to turn on the LC3 transistor 1322. Accordingly, if the select voltage $V_S$ is at its low voltage level, when the sense circuit controller 1206 transitions the LC3 control signal to the high voltage level, the LC3 transistor 1322 may respond by turning on. In turn, the BUS1 voltage $V_{BUS1}$ may be set to a low voltage level corresponding to the low voltage level of the select voltage $V_S$ since any charge on the first bus BUS1 may be discharged to the ground reference GND via the LC3 transistor 1322 and the first NMOS transistor 1312.

Similarly, if the unselect voltage $V_U$ is at its low voltage level, transitioning the LC4 control signal to its high voltage level may turn on the LC4 transistor 1324 because the gate-to-source voltage of the LC4 transistor 1322 will be great enough to turn on the LC4 transistor 1324. Accordingly, if the unselect voltage $V_U$ is at its low voltage level, when the sense circuit controller 1206 transitions the LC4 control signal to the high voltage level, the LC4 transistor 1324 may respond by turning on. In turn, the BUS1 voltage $V_{BUS1}$ may be set to a low voltage level corresponding to the low voltage level of the unselect voltage $V_U$ since any charge on the first bus BUS1 may be discharged to the ground reference GND via the LC4 transistor 1324 and the second NMOS transistor 1316.

In addition, the sense circuit 1300, the latch 1308, and the sense circuit controller 1206 may be configured to communicate with each other via a plurality of communication buses, one of which is the first bus BUS1. As described in further detail below, for a given sense operation, the sense circuit 1300 may be configured to generate the BUS1 voltage $V_{BUS1}$ at a sense result voltage level at or toward the end of the given sense operation. The sense result voltage level indicates a result of the given sense operation. The sense circuit 1300 may be configured to communicate the BUS1 voltage $V_{BUS1}$ at the sense result voltage level to the sense circuit controller 1206 and/or the latch 1308 via the first bus BUS1.

The plurality of communication buses may further include a second communications bus BUS2. The sense circuit controller 1206 may connected to the second bus BUS2 and be configured to communicate with the sense circuit 1300 and the latch 1308 via the first bus BUS1 and the second bus BUS2. A DSW transistor 1326 may be configured between the first bus BUS1 and the second bus BUS2 to electrically connect and disconnect the first bus BUS1 and the second bus BUS2 from each other. The sense circuit controller 1206 may be configured to output a DSW control signal to a gate terminal of the DSW transistor 1326 in order to electrically connect and disconnect the second bus DBUS to/from the first bus BUS1. Other configurations for the sense circuit 1300, including those that include additional latches other than the latch 1308, may include other or additional communications buses. Various configurations are possible.

In addition, the sense circuit 1300 may include a bit line connection circuit 1328 that is configured to electrically connect and disconnect the ith bit line BL(i) from the sense circuit 1300 and the latch 1308. When the bit line connection circuitry connects the ith bit line BL(i) to the sense circuit 1300, current may flow from the sense circuit 1300 to the ith bit line BL(i). Alternatively, when the bit line connection circuitry disconnects the ith bit line BL(i) from the sense circuit 1300, current may be prevented from flowing from the sense circuit 1300 to the ith bit line BL(i).

In addition, the sense circuit 1300 may include a bit line biasing circuit 1330 is configured to bias the ith bit line BL(i) by generating a bit line bias voltage $V_{BL}$ at a bit line bias node VBL. The amount of the bit line bias voltage $V_{BL}$ may depend on whether the ith bit line BL(i) is a selected bit line or an unselected bit line. In particular, when the ith bit line BL(i) is a selected bit line, the bit line biasing circuit 1330 may generate the bit line bias voltage $V_{BL}$ at the high supply voltage level VHSA or a level corresponding to the high supply voltage VHSA, and when the ith bit line BL(i) is an unselected bit line, the bit line biasing circuit 1328 may generate the bit line bias voltage $V_{BL}$ at the cell source voltage level Vcelsrc or a level corresponding to the cell source voltage Vcelsrc.

The sense circuit 1300 may further include a sense enable circuit 1332 that is controlled by a sense enable control signal CTRLS output from the sense circuit controller 1206. As described in further detail below, a sense voltage $V_{SEN}$ generated at a sense node SEN may increase due to charge accumulated at the sense node SEN. The sense circuit controller 1206 may output the sense enable control signal CTRLS to enable and disable the sense enable circuit 1332. As described in further detail below with respect to the timing diagram of FIG. 14, when the sense circuit controller 1206 enables the sense enable circuit 1332, current resulting from the charge accumulated at the sense node SEN may flow through the sense enable circuit 1332 and the bit line connection circuit 1328 to the ith bit line BL(i).

The sense circuit 1300 may also include a BLQ transistor 1334. The BLQ transistor 1334 has a gate terminal configured to receive a BLQ control signal from the sense circuit controller 1206, a drain terminal connected to the first bus BUS1 and a source terminal connected to the sense node SEN.

In addition, the sense circuit 1300 may include a first series-connected branch of transistors that includes a STB transistor 1336 and a sense transistor 1338. The sense transistor 1338 has a gate terminal connected to the sense node SEN and configured to receive the sense voltage $V_{SEN}$. In addition, the sense transistor 1338 has a drain terminal connected to a source terminal of the STB transistor 1336 and a source terminal connected to a threshold voltage tracking node VTT and configured to receive a threshold voltage tracking voltage $V_{VTT}$ generated at the threshold voltage tracking node VTT. The STB transistor 1336 also has a gate terminal configured to receive a STB control signal from the sense circuit controller 1206, and a drain terminal connected to the first bus BUS1.

As shown in FIG. 13, the threshold voltage tracking node VTT may be alternatingly connected to a threshold voltage tracking voltage source 1340 or to the ground reference GND via a first switch (SW1) 1342 and a first supply path 1344. The threshold voltage tracking voltage source 1340, which may be a component of the voltage supply circuitry, may be configured to output a first supply voltage $V_1$. The sense circuit controller 1206 may be configured to output a first control signal CTRL1 to the first switch 1342 to control whether the threshold voltage tracking node VTT and the first supply path 1344 are connected to the threshold voltage tracking voltage source 1340 or to the ground reference GND. When the sense circuit controller 1206 outputs the first control signal CTRL1 to connect the threshold voltage tracking node VTT to the threshold voltage tracking voltage source 1340, the threshold voltage tracking voltage source 1340 may supply its first supply voltage $V_1$ to the threshold voltage tracking node VTT via the first switch 1342 and the first supply path 1344, such that the voltage level of the threshold voltage tracking voltage $V_{VTT}$ is equal to or corresponds to the voltage level of the first supply voltage $V_1$. Alternatively, when the sense circuit controller 1206 outputs the first control signal CTRL1 to connect the threshold voltage tracking node VTT to the ground reference GND, the voltage level of the threshold voltage tracking voltage $V_{VTT}$ is equal or corresponds to the voltage level of voltage of the ground reference GND (i.e., the ground reference voltage).

The sense transistor 1338 may be configured to turn on and off depending on the level of the sense voltage $V_{SEN}$. As described in further detail below, when the sense circuit controller 1206 wants to know whether the sense voltage $V_{SEN}$ is at a voltage level that turns on or turns off the sense transistor 1338, the sense circuit controller 1206 may output the STB control signal to turn on the STB transistor 1336. In the event that the level of the sense voltage $V_{SEN}$ is high enough to turn on the sense transistor 1338, then the STB transistor 1336 and the sense transistor 1338 may operate to pull down the BUS1 voltage $V_{BUS1}$ to an associated low voltage level. Alternatively, in the event that the level of the sense voltage $V_{SEN}$ is at a low level to turn off the sense transistor 1338, then the BUS1 voltage $V_{BUS1}$ may remain at a high level.

Additionally, as described in further detail below with reference to FIG. 14, the BLQ transistor 1334, the STB transistor 1336, the sense transistor 1338, and the threshold voltage tracking node VTT may form a threshold voltage tracking circuit path that changes the sense voltage $V_{SEN}$ in the selected sense circuit from an initial pre-charge voltage level to a final pre-charge voltage level. The final pre-charge voltage level may be a voltage level that tracks or corresponds to the specific threshold voltage of the sense transistor 1338 according to a threshold voltage tracking methodology. To change the sense voltage $V_{SEN}$ to the final pre-charge voltage level, the threshold voltage tracking circuit configures the sense transistor 1338 as a diode-connected transistor by connecting or tying together the gate and drain terminals of the sense transistor 1338. While the sense transistor 1338 is configured as a diode-connected transistor and the threshold voltage tracking node VTT receives the first voltage $V_1$, the threshold voltage tracking circuit path may change the sense voltage $V_{SEN}$ from the initial pre-charge voltage level to a final pre-charge voltage level that tracks or corresponds to the threshold voltage of the sense transistor 1338. As explained in further detail below, the process or methodology of generating the sense voltage $V_{SEN}$ at a voltage level that corresponds to the specific threshold voltage of the sense transistor 1338 is referred to as a threshold voltage tracking process.

The sense circuit 1300 may further include a second-series connected branch of transistors that includes a LSL transistor 1346 and a BUS1 transistor 1348. The BUS1 transistor 1348 has a gate terminal connected to the first bus BUS1 and configured to receive the BUS1 voltage $V_{BUS1}$. In addition, the BUS1 transistor 1348 has a drain terminal connected to a source terminal of the LSL transistor 1346 and a source terminal connected to a pre-charge supply node PCS and configured to receive a pre-charge supply voltage $V_{PCS}$ supplied to the pre-charge supply node PCS. The LSL transistor 1338 also has a gate terminal configured to receive a LSL control signal from the sense circuit controller 1206, and a drain terminal connected to the sense node SEN.

As shown in FIG. 13, the pre-charge supply node PCS may be alternatingly connected to a pre-charge voltage source 1350 or to the ground reference GND via a second switch (SW2) 1352 and a second supply path 1354. The pre-charge voltage source 1350, which may be a component of the voltage supply circuitry, may be configured to output a second supply voltage $V_2$. The sense circuit controller 1206 may be configured to output a second control signal CTRL2 to the second switch 1352 to control whether the pre-charge supply node PCS and the second supply path 1354 are connected to the pre-charge voltage source 1350 or the ground reference GND. When the sense circuit controller 1206 outputs the second control signal CTRL2 to connect the pre-charge supply node PCT to the pre-charge voltage source 1350, the pre-charge voltage source 1350 may supply its second supply voltage $V_2$ to the pre-charge supply node PCS via the second switch 1352 and the second supply path 1354, such that the voltage level of the pre-charge supply voltage $V_{PCS}$ is equal or corresponds to the voltage level of the second supply voltage $V_2$. Alternatively, when the sense circuit controller 1206 outputs the second control signal CTRL2 to connect the pre-charge supply node PCS to the ground reference GND, the voltage level of the pre-charge supply voltage $V_{PCS}$ is equal or corresponds to the voltage level of the ground reference voltage.

As described in further detail below with reference to FIG. 14, when the LSL transistor 1346 and the BUS1 transistor 1348 are turned on, they may form a reset or discharge circuit path with the pre-charge supply node PCS that operates to discharge charge accumulated on the sense node SEN and/or pull down the level of the sense voltage $V_{SEN}$, such as to reset the voltage level of the sense voltage $V_{SEN}$. Additionally, the LSL transistor 1346, the BUS1 transistor 1348, and the pre-charge supply node PCS may form a pre-charge circuit path that pre-charges the sense node SEN with the pre-charge supply voltage $V_{PCS}$ at its pre-charge voltage level during a charge portion of a pre-charge period of a sense operation. Accordingly, the circuit components that form the discharge circuit path to reset the sense voltage $V_{SEN}$—i.e., the LSL transistor 1346, the BUS1 transistor 1348, and the pre-charge supply node PCS—also form the pre-charge circuit path to pre-charge the sense node SEN.

The sense circuit 1300 may also include a LPC transistor 1356 that has a gate terminal configured to receive a LPC control signal from the sense circuit controller 1206, a drain terminal configured to receive a second high supply voltage VHLB, and a source terminal connected to the first bus BUS1. As described in further detail below with reference to FIG. 14, the sense circuit controller 1206 may output the LPC control signal to turn on the LPC transistor 1356 in order to set the BUS1 voltage $V_{BUS1}$ to certain voltage levels at certain, predetermined times during a sense operation.

The sense circuit 1300 may further include a charge-storing circuit 1358. In general, the charge-storing circuit 1358 is any type of circuit component or combination of circuit components configured to store charge and generate a voltage based on the stored charge. An example configuration of the charge-storing circuit 1358 may be a capacitor, although other circuits or combinations of circuits, including active circuits, passive circuits, or combinations thereof, may be implemented as the charge-storing circuit 1358. The charge-storing circuit 1358 may include a first end or terminal connected to the sense node SEN and a second end or terminal connected to a pulse node CLK.

The voltage supply circuitry (or alternatively the sense circuit controller 1206) may be configured to generate an input or pre-sense pulse CLKSA and supply the input pulse CLKSA to the charge-storing circuit 1346. In particular, the voltage supply circuitry may supply the input pulse CLKSA to the pulse node CLK, and the charge-storing circuit 1358 may receive the input pulse CLKSA by having its second end connected to the pulse node CLK. Upon receipt of the input pulse CLKSA, the charge-storing circuit 1358 may be configured to generate the sense voltage $V_{SEN}$ at the sense node SEN at a pre-sense voltage level that corresponds to the voltage level of the input pulse CLKSA multiplied by a coupling ratio Cr of the charge-storing circuit 1358.

As described in further detail below with respect to FIG. 14, the sense circuit 1300 may be configured perform a state-dependent pre-charge operation. The pre-charge operation is an operation that the sense circuit 1300 performs during a per-charge period of a given sense operation, during which the sense circuit 1300 generates the sense voltage $V_{SEN}$ at a pre-charge level. The pre-charge operation that the sense circuit 1300 performs is state-dependent in that whether or not the sense circuit 1300 performs the pre-charge operation depends on whether the sense circuit 1300 is connected to a selected bit line or an unselected bit line for the given sense operation. If the sense circuit is connected to a selected bit line, then the sense circuit 1300 is configured to perform the pre-charge operation and generate the sense voltage $V_{SEN}$ at the pre-charge level. Alternatively, if the sense circuit is not connected to a selected bit line—i.e., it is connected to an unselected bit line—then the sense circuit 1300 may not perform the pre-charge operation, and instead may maintain the sense voltage $V_{SEN}$ at the ground reference voltage during the pre-charge period of the given sense operation.

For memory systems that perform sense operations, such as the memory system 100 shown and described with reference to FIGS. 1A-2B, thousands of sense circuits may simultaneously perform their respective sense operations as part of a read or verify process. The pre-charge operation consumes power, and so power consumption within the memory system can be reduced by configuring and controlling the sense circuits so that only those sense circuits connected to selected bit lines perform the pre-charge operation.

Also, as described in further detail below with reference to FIG. 14, by having the circuit configuration shown in FIG. 13, the sense circuit 1300 can perform the pre-charge operation in accordance with a threshold voltage tracking methodology or process. In accordance with the threshold voltage tracking methodology, the pre-charge voltage level at which the sense circuit 1300 generates the sense voltage $V_{SEN}$ during the pre-charge operation corresponds to the threshold voltage that is specific to the sense transistor 1338 of the sense circuit 1300. Doing so can enhance the ability of the sense circuit 1300 to detect a result of the sense operation that accurately indicates the state of the target memory cell MC(T).

Figure 14:
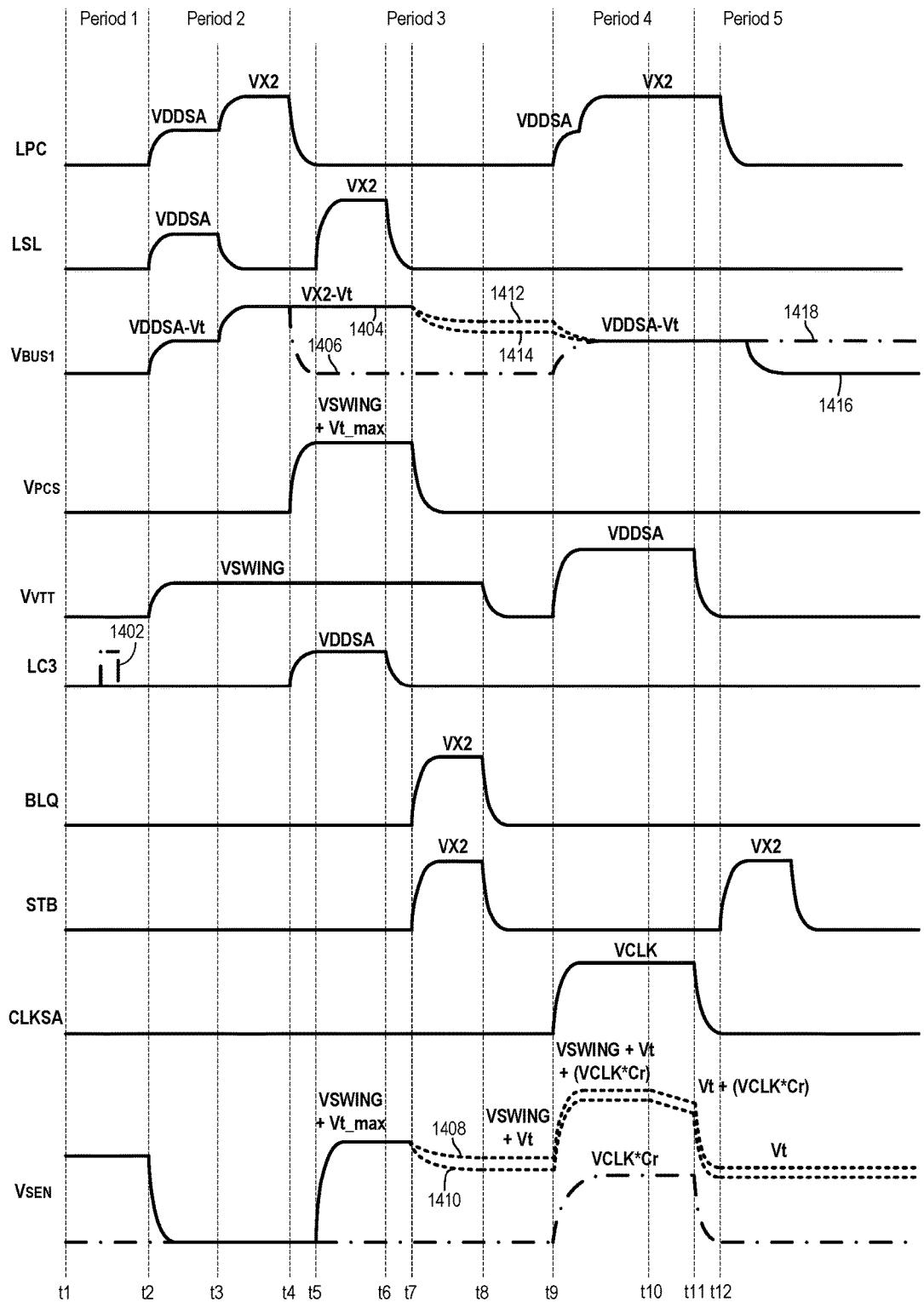
FIG. 14 is a timing diagram of waveforms of voltages and signals generated during a sense operation.

FIG. 14 shows a timing diagram of certain voltages and control signals generated in and/or communicated to sense circuits during operation of a sense operation. A method of performing the sense operation is described with reference to FIG. 14. The method is described with reference to two sense circuits, each having the configuration of the sense circuit 1300 shown in FIG. 13, each connected to an associated bit line and NAND string, such the ith bit line BL(i) and NAND string 1302 shown in FIG. 13, and each connected to an associated latch, such as the latch 1308 shown in FIG. 13. The two sense circuits include a selected sense circuit and an unselected sense circuit. The selected sense circuit is referred to as being selected because it is connected to a selected bit line during operation of the sense operation. Similarly, the unselected sense circuit is referred to as being unselected because it is connected to an unselected bit line during operation of the sense operation. Also, the latch (e.g., the latch 1308) connected to the selected sense circuit is referred to as a selected latch, and the latch connected to the unselected sense circuit is referred to as an unselected latch.

As previously described, a sense operation may be performed on a group of target memory cells of a block that are connected to the same word line as part of a given read operation or a given verify operation (or a verify portion of a program-verify operation). For the given read operation, the target memory cells are those memory cells in a block from which data values of data are to be determined. For the given verify operation, the target memory cells are those memory cells in a block into which data is being programmed. One or more of the sense blocks 146 shown in FIG. 2B may be involved in one or more sense operations that are part of the given read operation or the given verify operation. In a single sense operation for the given read operation or the given verify operation, some sense circuits 1202 (FIG. 12) of the one or more sense blocks 146 involved in the one or more sense operations may be connected to selected bit lines while other sense circuits 1202 of the one or more sense blocks 146 may be connected to unselected bit lines. For the single sense operation, a sense circuit controller 1206 (FIG. 12) and/or the control logic 154 (FIG. 2B) may want to know whether current, or a threshold amount of current, is conducting through the selected bit lines. The sense circuit controller 1206 and/or the control logic 154 may not want to know whether current, or the threshold amount of current, is conducting through the unselected bit lines.

The control logic 154 and/or one or more of the sense circuit controllers 1206 of the sense blocks 146 may be configured to select which of the bit lines connected to the target memory cells are to be selected bit lines and which are to be unselected bit lines for the single sense operation. For a given read operation, the control logic 154 and/or the one or more sense circuit controllers 1206 may identify the selected and unselected bit lines according to a predetermined read scheme that is used in order to identify the threshold voltages $V_{TH}$ of the memory cells, and in turn the data values of the data the target memory cells are storing. For a given verify operation, the control logic 154 and/or the one or more sense circuit controllers 1206 may identify the selected and unselected bit lines according to a program scheme that is used to program the target memory cells into various, different programmed states.

In accordance with at least some example program schemes, a single sense operation may be associated with a given memory state. For the single sense operation, the control logic 154 and/or the one or more sense circuit controllers 1206 may identify a bit line to be a selected bit line if the target memory cell connected to the bit line is assigned to be programmed into the given memory state associated with the single sense operation. Conversely, the control logic 154 and/or the one or more sense circuit controllers 1206 may identify a bit line to be an unselected bit line if the target memory cell is not assigned to be programmed into the given memory state associated with the single sense operation.

The selected sense circuit involved in the sense operation described with reference to FIG. 14 may be one of the sense circuits connected to a selected bit for a single sense operation that is part of a read operation or a verify operation. Additionally, the unselected sense circuit involved in the sense operation described with reference to FIG. 14 may be one of the sense circuits connected to an unselected bit line for a single sense operation that is part of a read operation or a verify operation.

For some example configurations, the selected sense circuit includes or is connected to its own first switch 1342 and its own second switch 1352, and the unselected sense circuit includes or is connected to its own first switch 1342 and its own second switch 1352. Additionally, for some example configurations, the selected sense circuit and the unselected sense circuit may both be configured to be connected to the same threshold voltage tracking voltage source 1340, and may both be configured to be connected to the same pre-charge voltage source 1350. For other example configurations, the selected and unselected sense circuits may be configured to be connected to different threshold voltage tracking voltage sources 1340, and/or may be configured to be connected to different pre-charge voltage sources 1350. For simplicity, in the sense operation described with respect to FIG. 14, a single threshold voltage tracking voltage source 1340 supplies the first supply voltage $V_1$ to both the selected and unselected sense circuits, and a single pre-charge voltage source 1350 supplies the second supply voltage $V_2$ to both the selected and unselected sense circuits.

In addition, the sense operation described with reference to FIG. 14 is performed over five consecutive periods or stages. Other example sense operations may include more or fewer than five periods. As examples, two or more of the five periods may be combined under a single period, one or more of the five periods may be divided into separate periods, or a sense operation may include other periods that are not described and the periods that are described may come before or after the five that are described. Also, the time durations of the time periods relative to each other are not necessarily drawn to scale.

Also, FIG. 14 shows the voltage waveforms of the control signals and voltages as solid lines, dash-dot lines, or small dashed lines. For a given control signal or voltage, at a given time or over a given period of time: if a single solid line is shown, the single solid line represents the voltage level of the voltage or control signal that is sent to or generated in both the selected sense circuit and the unselected sense circuit or sent to or generated in both the selected latch and the unselected latch; if both a solid line and a dash-dot line are shown, the solid line represents the voltage level of the voltage or control signal that is sent to or generated in the selected sense circuit or selected latch, and the dash-dot line represents the voltage level of the voltage or control signal that is sent to or generated in the unselected sense circuit or unselected latch; and if multiple small dashed lines are shown, such small dashed lines represent possible different voltage levels of the given control signal or voltage generated for that given time or time period.

The first period (Period 1) may be referred to as a bit line selection period, and may start at an initial time t1. In the first period, the control logic 154 and/or the sense circuit controllers 1206 may determine the selected bit lines and the unselected bit lines for the sense operation. For some example sense operations, at least some of the unselected bit lines may be locked out bit lines. As mentioned, a single sense operation of a verify operation may be associated with one of a plurality of programmed states. In general, the control logic 154 and/or the sense circuit controllers 1206 may select those bit lines that are connected to target memory cells assigned to be in the programmed state associated with the sense operation. Several program operations may be needed to successfully program a given memory cell in a given programmed state. Additionally, not all memory cells assigned to the same programmed state may be successfully programmed at the same time or following performance of the same program operation. Of the target memory cells assigned to the same programmed state, which of the target memory cells were successfully programmed and which have not yet been successfully programmed may be determined by the control logic 154 and/or the sense circuit controllers 1206 following a verify operation. Upon identifying which of the target memory cells were successfully programmed, the control logic 154 and/or the sense circuit controllers 1206 may lock out those target memory cells from future programming and verify portions of the program-verify operation. For future program and/or verify operations, the control logic 154 and/or the sense circuit controllers 1206 may identify those locked-out target memory cells as part of the unselected memory cells, and their associated bit lines as unselected bit lines.

As mentioned, the sense operation described with reference to FIG. 14 is described with reference to a selected sense circuit connected to a selected bit line and an unselected sense circuit connected to an unselected bit line. The selected bit line may be one of the selected bit lines identified in the first period. Likewise, the unselected bit line may be one of the unselected bit lines identified in the first period.

Additionally, in the first period, the sense circuit controller 1206 may output respective latch control signals to each of the selected latch and the unselected latch to cause each of selected latch and the unselected latch to perform respective latch write operations. The sense circuit controller 1206 may output the latch control signals according to the sequences in the reset and set periods, as previously described. For clarity, FIG. 14 shows the voltage waveform for the LC3 control signal, but not for the other latch control signals (i.e., the LC1, LC2, and LC4 control signals). Additionally, FIG. 14 shows a voltage pulse 1402 of the LC3 control signal that is sent to the unselected latch during the set period to cause the unselected latch to generate its select voltage $V_S$ at its associated low voltage level and its unselect voltage $V_U$ at its associated high voltage level. As shown, the LC3 signal control that is sent to the selected latch stays at its low voltage level during the first period.

Also, prior to the initial time t1, the selected and unselected sense circuits may have been subjected to a prior sense operation. As previously described, the sense circuits involved in the sense operation may be state-dependent with respect to a pre-charge operation, meaning that the selected sense circuit will generate the sense voltage $V_{SEN}$ at a pre-charge level during the pre-charge period of the sense operation, whereas the unselected sense circuit will keep the sense voltage $V_{SEN}$ at a low voltage level, such as the ground reference voltage, during the pre-charge period. As a result of the state dependency, at the end of a given sense operation, selected sense circuits may generate their respective sense voltages $V_{SEN}$ at an associated high voltage level that is higher than an associated low voltage level at which unselected sense circuits generate their respective sense voltage $V_{SEN}$. The associated low voltage level may be at or near the ground reference voltage level, and/or may be the same level at which the unselected sense circuit generates its sense voltage $V_{SEN}$ during the pre-charge period. Assuming that the selected sense circuit was also a selected sense circuit during the prior sense operation and the unselected sense circuit was also an unselected sense circuit during the prior sense operation, FIG. 14 shows the selected sense circuit generating its sense voltage $V_{SEN}$ at an associated high voltage level, and the unselected sense circuit generating its sense voltage $V_{SEN}$ at an associated low voltage level at the start of the sense operation in the first period.

In the second period (Period 2) starting at a second time t2, the selected and unselected sense circuits may set their respective BUS1 voltages $V_{BUS1}$ and sense voltages $V_{SEN}$ at voltage levels in preparation of the pre-charge period. During the second period, the selected and unselected sense circuits may also perform a discharge operation during which they reset or pull down their respective sense voltages $V_{SEN}$ to an associated low voltage level, such as the ground reference voltage.

In further detail, during the second period, the selected and unselected sense circuits may each set their respective BUS1 voltages $V_{BUS1}$ by increasing their respective BUS1 voltages $V_{BUS1}$ to an associated high voltage level VX2-Vt. To do so, the sense circuit controller 1206 may output a LPC control signals to the LPC transistors 1356 of each of the selected sense circuit and unselected sense circuit to turn on the LPC transistors 1356.

As shown in FIG. 14, for some example configurations, the sense circuit 1206 may output the first and second LPC control signals to generate the BUS1 voltage at the associated high voltage level VX2-Vt in two stages. In a first stage, starting at the second time t2, the sense circuit controller 1206 may increase the LPC control signals from an associated low voltage level to an intermediate voltage level VDDSA, which in turn may turn on the LPC transistors 1356 of each of the selected and unselected sense circuits. In response to turning on, the LPC transistors 1356 of each of the selected and unselected sense circuits may increase the BUS1 voltage $V_{BUS1}$ from its associated low voltage level to its associated intermediate voltage level VDDSA-Vt, which is the intermediate voltage level VDDSA of the LPC control signals minus the threshold voltage Vt of the LPC transistors 1356. In a second stage, starting at a third time t3, the sense controller 1206 may increase the voltage level of the LPC control signals from the intermediate voltage level VDDSA to the high voltage level VX2. In response, the LPC transistors 1356 may increase their respective BUS1 voltages to the associated high voltage level VX2-Vt, where VX2 is the high voltage level of the LPC control signals and Vt is the threshold voltage of the LPC transistors.

In some example configurations, the voltage supply circuitry and/or the sense circuit controllers 1206 may receive an external supply voltage, such as from the controller 102, another component of the memory system 100, or directly from a host connected to the memory system 100, and may be configured to generate the supply voltages and/or control signals in response to receipt of the external supply voltage. The intermediate voltage level VDDSA may be equal to or correspond to the voltage level of the external supply voltage. For some example configurations, the intermediate voltage level VDDSA may not be a high enough voltage level for performance of sense operations. The voltage supply circuitry and/or the sense circuit controllers 1206 may include charge pump circuitry or other similar circuitry in order to generate supply voltages and control signals at voltage levels higher than the intermediate voltage level VDDSA, such as the high voltage level VX2. Accordingly, for these example configurations, in the second period, the sense circuit controller 1206 may use the external supply voltage to generate the LPC control signals at the intermediate voltage level VDDSA from the second time t2 to the third time t3, and then may utilize charge pump circuitry to increase the voltage level of the LPC control signals from the intermediate voltage level VDDSA to the high voltage level VX2 at the third time t3.

For other example configurations, at the start of the second period, the sense circuit controller 1206 may increase the voltage level of the LPC control signals from the low voltage level directly up to the high voltage level VX2 without maintaining the voltage level at the intermediate voltage level VDDSA for a period of time. However, first increasing the voltage level to the intermediate voltage level VDDSA between the second and third times t2, t3, and then increasing the voltage level from the intermediate voltage level VDDSA to the high voltage level VX2, as described with reference to FIG. 14, may be more efficient in terms of power consumption.

In addition, during the second period, the selected and unselected sense circuits may perform a discharge or reset operation in the second period, during which the selected and unselected sense circuits discharge any charge stored in the charge-storing circuit 1358 to reset or decrease the sense voltage $V_{SEN}$ down to its associated low voltage level, which may be the ground reference voltage. To do so, the selected and unselected sense circuits may each form respective discharge or reset paths from their respective sense nodes SEN to the ground reference GND via their respective LSL transistors 1346 and respective BUS1 transistors 1348. In each of the selected and unselected sense circuits, the discharge circuit path may be formed by connecting the pre-charge supply node PCS to the ground reference GND and turning on each of the LSL transistor 1346 and the BUS1 transistor. To do so, the sense circuit controller 1206 may output the second control signals CTRL2 to the second switches 1352 connected to each of the selected and unselected sense circuits so that each of the pre-charge supply nodes PCS are connected to the ground reference GND. Additionally, the BUS1 transistors 1348 turn on in response to the increase of the BUS1 voltages $V_{BUS1}$ to the intermediate voltage level VDDSA. Also, as shown in FIG. 14, the sense circuit controller 1206 may increase the LSL control signals output to each of the selected and unselected sense circuits from their associated low voltage level to the intermediate voltage level VDDSA to turn on the LSL transistors 1346. With the discharge paths being formed, the discharge path of the selected sense circuit may pull down the sense voltage $V_{SEN}$ to the ground reference voltage and the discharge path of the unselected sense circuit may keep the sense voltage $V_{SEN}$ pulled down to the ground reference voltage at the start of the second period.

In the example sense operation, after the discharge circuit paths of the selected and unselected sense circuits have decreased the respective sense voltages $V_{SEN}$ down to the ground reference voltage, such as by the third time t3, the sense circuit controller 1206 may decrease the LSL control signals back down to their associated low voltage levels in order to turn off the LSL transistors 1346 by the third time t3. Doing so disables the discharge circuit paths so that by the third time t3, the LSL transistors 1346 and the BUS1 transistors 1348 no longer form reset or discharge paths between the sense nodes SEN and the ground reference GND of their respective selected and unselected sense circuits.

In addition, at the third time t3, the sense circuit controller 1206 may output the first control signals CTRL1 to the first switches 1342 of each of the selected and unselected sense circuits in order to connect each of the threshold voltage tracking nodes VTT to the threshold voltage tracking voltage source 1340. In response to output of the first control signals CTRL1, the voltage levels of the threshold voltage tracking nodes VTT may each increase from an associated low voltage level (e.g., the ground reference voltage) to a voltage level equal to or corresponding to the voltage level of the first supply voltage $V_1$ output from the threshold voltage tracking voltage source 1340.

As shown in FIG. 14, output of the first supply voltage $V_1$ to the threshold voltage tracking node VTT may cause the threshold voltage tracking voltage $V_{VTT}$ to increase from the ground reference voltage to a swing voltage amount or level VSWING. As described in further detail below with reference to the third period, the swing voltage level VSWING is an amount of voltage that a sense voltage $V_{SEN}$ generated in a selected sense circuit drops during a bit line connection sub-period when the sense node SEN is connected to its associated bit line via the sense enable circuit 1332, and the target memory cell MC(T) is sufficiently programmed (i.e., the target memory cell's threshold voltage $V_{TH}$ is at a sufficiently high level). Additionally, as described in further detail below, during the pre-charge period, the selected sense circuit configures its sense transistor 1338 as a diode-connected transistor in order to generate the sense voltage $V_{SEN}$ at a final pre-charge voltage level that is the sum of the swing voltage level VSWING and the threshold voltage Vt of the sense transistor 1338, denoted in FIG. 14 as VSWING+Vt. In the diode-connected configuration, the gate and drain terminals of the sense transistor 1338 form a first terminal of the diode connection, and the source terminal forms a second terminal of the diode connection. The first terminal is connected to the sense node SEN, and second terminal is connected to the pre-charge supply node PCS. In order for the diode-connected sense transistor 1338 to generate the sense voltage $V_{SEN}$ at the final pre-charge voltage level VSWING+Vt, the threshold voltage tracking voltage source 1340 outputs the first supply voltage $V_1$ to bias the threshold voltage tracking node VTT, and in turn the source terminal of the sense transistor 1338, to the swing voltage level VSWING. The threshold voltage tracking voltage source 1340 may output the first supply voltage $V_1$ to bias the threshold voltage tracking node VTT to the swing voltage level VSWING prior to when the selected sense circuit generates the sense voltage $V_{SEN}$ at the final pre-charge voltage level VSWING+Vt, which is the seventh time t7 in FIG. 14. FIG. 14 shows the threshold voltage tracking voltage $V_{VTT}$ increasing to the swing voltage level VSWING at the start of the second period (i.e., at the second time t2), although in other example sense operations, the threshold voltage tracking voltage source 1340 may increase the threshold voltage tracking voltage $V_{VTT}$ to the swing voltage level VSWING at other times after the second time t2 but before the seventh time t7.

Also in the second period, the bit line biasing circuit 1330 of the selected sense circuit may bias its associated bit line bias node VBL to a bit line bias voltage $V_{BL}$ at the high supply voltage level VHSA, the bit line biasing circuit 1330 of the unselected sense circuit may bias its associated bit line bias node VBL to a bit line bias voltage $V_{BL}$ to the cell source voltage level Vcelsrc.

The third period (Period 3) is the pre-charge period starting at a fourth time t4, during which the selected and unselected sense circuits perform a state-dependent pre-charge operation, meaning that the selected sense circuit generates its sense voltage $V_{SEN}$ first at an initial pre-charge voltage level and then at a final pre-charge voltage level, while the unselected sense circuit maintains its sense voltage $V_{SEN}$ at the associated low voltage level, such as the ground reference voltage. The selected and unselected sense circuits may perform the state-dependent pre-charge operation in two stages, including a charge stage extending from the fourth time t4 to the seventh time t7, and a discharge stage (also referred to as a threshold voltage tracking stage) extending from the seventh time t7 to a ninth time t9. By the end of the pre-charge period at the ninth time t9, the selected sense circuit will be generating its sense voltage at the final pre-charge voltage level VSWING+Vt.

In the charge stage of the pre-charge operation, the pre-charge voltage source 1350 may supply the second supply voltage $V_2$ to the pre-charge supply node PCS in order to generate the pre-charge supply voltage $V_{PCS}$ at its pre-charge level VSWING+Vt_max. The pre-charge level VSWING+Vt_max may also be an initial pre-charge level of the sense voltage $V_{SEN}$. In turn, a pre-charge circuit path formed by the LSL transistor 1346, the BUS1 transistor 1348, and the pre-charge supply node PCS may pre-charge the sense node SEN by supplying the pre-charge supply voltage $V_{PCS}$ to the sense node SEN. Accordingly, the pre-charge supply node PCS may receive the second supply voltage $V_2$, and in response, the pre-charge circuit path may increase the sense voltage $V_{SEN}$ to its initial pre-charge level VSWING+Vt_max by supplying the pre-charge voltage $P_{PCS}$ to the sense node SEN.

The term Vt_max denotes a predetermined highest or maximum possible threshold voltage for the sense transistor 1338. As previously described, thousands of sense circuits having associated sense transistors 1338 may be configured on a single memory die 104 and simultaneously perform a sense operation. Due to manufacturing process imperfections, these various sense transistors 1338 may not all have the same threshold voltage. In general, the collection of sense transistors 1338 may have an associated distribution of threshold voltages. The maximum possible threshold voltage Vt_max may represent a predetermined highest or maximum possible threshold voltage for the collection of sense transistors 1338. This way, when the sense voltage $V_{SEN}$ is generated at the initial pre-charge voltage level VSWING+Vt_max, and the sense transistor 1338 is configured as a diode-connected transistor, and the source terminal of the sense transistor 1338 receives the threshold voltage tracking voltage $V_{VTT}$ at the swing voltage level VSWING, the voltage difference between the gate and drain terminals (i.e., the first terminal of the diode connection) and the source terminal (i.e., the second terminal of the diode connection) will be least the threshold voltage Vt of the sense transistor 1338.

In order to form the pre-charge circuit path, the LSL transistor 1346 and the BUS1 transistor 1348 are both turned on in order to create a path for current to flow between the pre-charge supply node PCS and the sense node SEN. In the example sense operation described with reference to FIG. 14, the selected and unselected sense circuits form the pre-charge circuit paths in a state-dependent manner, meaning that the pre-charge circuit path is formed or is enabled in the selected sense circuit, but a pre-charge circuit path is not formed or is disabled in the unselected sense circuit. The LSL control signal is a global signal, meaning that the sense circuit controller 1206 applies the LSL control signals at the same voltage level to the LSL transistors 1346 of both the selected sense circuit and the unselected sense circuit. Accordingly, in order for the pre-charge circuit paths to perform the pre-charge operation in a state dependent manner, the selected sense circuit may turn on its BUS1 transistor 1348 while the unselected sense circuit may turn off its BUS1 transistor 1348. By being turned on, the sense transistor 1338 of the selected sense circuit is allowed to supply the pre-charge supply voltage $V_{PCS}$ to the sense node SEN of the selected sense circuit. Conversely, by being turned off, the sense transistor 1338 of the unselected sense circuit is prevented from supplying the pre-charge supply voltage $V_{PCS}$ to the sense node SEN of the unselected sense circuit. Accordingly, in the selected sense circuit, by turning on both the LSL transistor 1346 and the BUS1 transistor 1348, the pre-charge circuit path in the selected sense circuit is enabled to pre-charge the sense node SEN with the pre-charge supply voltage $V_{PCS}$. On the other hand, in the unselected sense circuit, by turning off the BUS1 transistor 1348, the pre-charge circuit path in the unselected sense circuit is disabled, and thus prevented from pre-charging the sense node SEN with the pre-charge supply voltage $V_{PCS}$.

In order to enable the pre-charge circuit path in the selected sense circuit, the selected sense circuit is configured to keep its BUS1 voltage at its associated high voltage level VX2-Vt during the third period in order to keep its BUS1 transistor turned on. Conversely, in order to disable the pre-charge circuit path in the unselected sense circuit, the unselected sense circuit is configured to lower its BUS1 voltage $V_{BUS1}$ to its associated low voltage level at the start of the third period (i.e., at the fourth time t4) in order to turn off its BUS1 transistor 1348.

Also, at the fourth time t4, the sense circuit controller 1206 lowers the voltage level of the LPC control signal from the high voltage level VX2 to the low voltage level in order to turn off the LPC transistors 1344 of both the selected and unselected sense circuits. This way, the LPC transistors 1344 are floating relative to the first bus BUS1 and thus not able to influence the voltage levels of the BUS1 voltage $V_{BUS1}$ during the pre-charge period.

The selected and unselected sense circuits may utilize their latches 1308 to enable the pre-charge circuit path in the selected sense circuit by turning on the BUS1 transistor 1348 in the selected sense circuit, and to disable the pre-charge circuit path in the unselected sense circuit by turning off the BUS1 transistor 1348 in the unselected sense circuit. To do so, at the fourth time t4, the sense circuit controller 1206 transitions the LC3 control signals to their associated high voltage levels to turn on the LC3 transistors 1322 in both the selected latch and the unselected latch, as shown in FIG. 14. For some example configurations, the associated high level of the LC3 control signal may be the intermediate voltage level VDDSA. As previously described, transitioning the voltage level of the LC3 control signal causes the latch 1308 to perform a latch read operation, which can set the voltage level of the BUS1 voltage $V_{BUS1}$ to correspond to the voltage level of the select voltage $V_S$. However, for the selected latch, because the select voltage $V_S$ is at its associated high voltage level, then when the sense circuit controller 1206 transitions the LC3 control signal output to the selected latch to its high voltage level VDDSA at the fourth time t4 for the selected latch to perform a latch read operation, the LC3 transistor 1322 does not turn on, and the first bus BUS1 remains floating relative to the select node S of the selected latch. In turn, the selected latch is prevented from disabling the pre-charge circuit path in response to receipt of the control signal, and the BUS1 voltage $V_{BUS1}$ of the selected sense circuit stays at its associated high voltage level VX2-Vt. The BUS1 voltage $V_{BUS1}$ in the selected sense circuit staying at its associated high voltage level VS2-Vt is depicted by curve 1404 in FIG. 14.

On the other hand, for the unselected latch, because the select voltage $V_S$ is at its associated low voltage level, then when the sense circuit controller 1206 transitions the LC3 control signal output to the unselected latch to its high voltage level VDDSA at the fourth time t4, the unselected latch responds by performing a latch read operation and allows charge on the first bus BUS1 to discharge through the LC3 transistor 1322 and the first NMOS transistor 1312 to the ground reference GND. In turn, the BUS1 voltage $V_{BUS1}$ generated in the unselected sense circuit is pulled down from its high voltage level VX2-Vt to its low voltage level. Thus, as shown in FIG. 14, during the charge stage from the third time t3 to the seventh time t7, the BUS1 voltage $V_{BUS1}$ of the selected sense circuit stays at its high voltage level VX2-Vt to turn on the BUS1 transistor 1348 of the selected sense circuit, while the BUS1 voltage $V_{BUS1}$ of the unselected sense circuit is pulled down and kept at its low voltage level to turn off the BUS1 transistor 1348 of the unselected sense circuit. The BUS1 voltage $V_{BUS1}$ in the unselected sense circuit being pulled down to its associated low voltage level is depicted by curve 1406 in FIG. 14.

Also, at the start of the third period (i.e., at the fourth time t4), the sense circuit controller 1206 may output the second control signal CTRL2 to at least the second switch 1352 of the selected sense circuit in order to connect the pre-charge voltage source 1350 with the pre-charge supply node PCS. At this time, the pre-charge voltage source 1350 may begin supplying the second supply voltage $V_2$ to the pre-charge supply node PCS, and in turn, the pre-charge supply voltage $V_{PCS}$ may begin increasing up to its pre-charge voltage level VSWING+Vt_max. Additionally, parasitic capacitance between the gate and source terminals of the BUS1 transistor 1348 may cause the increase in the pre-charge supply voltage $V_{PCS}$ to couple up the BUS1 voltage $V_{BUS1}$, which in turn may help maintain the BUS1 voltage $V_{BUS1}$ at its associated high voltage level VX2-Vt in order to keep the BUS1 transistor 1363 turned on during the third period. Accordingly, during the charge stage, the BUS1 voltage $V_{BUS1}$ may stay at its associated high voltage level by floating high relative to the selected latch, and being coupled up in response to the increase in the pre-charge supply voltage $V_{PCS}$.

At the fifth time t5 (i.e., by the time that the pre-charge supply voltage $V_{PCS}$ has increased to its pre-charge voltage level VSWING+Vt_max), the sense circuit controller 1206 may increase the voltage level of the LSL control signal up to the high voltage level VX2 in order to turn on the LSL transistor 1346 and form the pre-charge circuit path in the selected sense circuit. In some example configurations, as shown in FIG. 14, the sense circuit controller 1206 increases the voltage level of the LSL control signal to the high voltage level VX2 instead of the intermediate voltage level VDDSA in order to ensure that the LSL transistor 1346 turns on at the fifth time t5, in view of the BUS1 voltage $V_{BUS1}$ being at its associated high level VX2-Vt instead of its associated intermediate voltage level VDDSA-Vt.

With both the LSL transistor 1346 and the BUS1 transistor 1348 of the selected sense circuit turned on at or shortly after the fifth time t5, the LSL transistor 1346 and the BUS1 transistor 1348 may supply the pre-charge supply voltage $V_{PCS}$ at the pre-charge supply node PCS to the sense node SEN, which in turn causes the sense voltage $V_{SEN}$ to increase from its associated low voltage level to its initial pre-charge level VSWING+Vt_max, starting at the fifth time t5 as shown in FIG. 5. Also, as described, during the charge stage, as the selected sense circuit increases and maintains its sense voltage $V_{SEN}$ at the initial pre-charge level VSWING+Vt_max, the unselected sense circuit keeps its sense voltage $V_{SEN}$ at the associated low level, according to the state-dependent pre-charge operation.

After the pre-charge circuit path of the selected sense circuit increases the voltage level of the sense voltage $V_{SEN}$ to its initial pre-charge level VSWING+Vt_max, such as by a sixth time t6, the sense circuit controller 1206 may lower the voltage level of the LSL control back down to the associated low voltage level. In response, the LSL transistor 1346 of the selected sense circuit turns off, disabling the pre-charge circuit path.

Additionally, after the unselected latch executes the read operation to lower the BUS1 voltage $V_{BUS1}$ to the low voltage level, the sense circuit controller 1206 may lower the voltage levels of the LC3 control signals back down to their associated low voltage levels so that by the end of the sense operation, the selected and unselected latches are configured in their steady states. For some example sense operations, the sense circuit controller 1206 may pull down the voltage level of the LC3 control signals at the sixth time t6.

The seventh time t7 may mark the end of the charge stage of the pre-charge operation and the start of the discharge stage (or threshold voltage tracking stage) of the pre-charge operation. As shown in FIG. 14, at the seventh time t7, the pre-charge supply voltage $V_{PCS}$ may decrease from its pre-charge level VSWING+Vt_max down to its associated low voltage level. For example, at the seventh time t7, the sense circuit controller 1206 may output the second control signal CTRL2 to the second switch 1352 to cause the pre-charge supply node PCS to be connected to the ground reference GND instead of the pre-charge voltage source 1350. In the selected sense circuit, the LSL transistor 1346 and the BUS1 transistor 1348 function as both the discharge circuit path in the first period and the pre-charge circuit path in the third period. After the charge stage of the pre-charge operation, reconnecting the pre-charge supply node PCS to the ground reference GND allows the LSL transistor 1346 and the BUS1 transistor 1348 to again form the discharge circuit path for a next sense operation.

In addition, during and/or by the end of the discharge stage, the selected sense circuit may generate its sense voltage $V_{SEN}$ according to a threshold voltage tracking methodology, in which the voltage level of the sense voltage $V_{SEN}$ by the end of the discharge stage is a voltage level that corresponds to the specific or particular threshold voltage of the sense transistor 1338 of the selected sense circuit. In particular, during and/or by the end of the discharge stage, the selected sense circuit may generate its sense voltage $V_{SEN}$ at the final pre-charge level VSWING+Vt, where Vt denotes the threshold voltage that is specific to the sense transistor 1338 of the selected sense circuit. In contrast, the initial pre-charge level VSWING+Vt_max is a general or global voltage level at which all of the selected sense circuits simultaneously involved in the sense operation may generate their respective sense voltages $V_{SEN}$.

As previously described, toward the end of the sense operation in the fifth period, the selected sense circuit may generate its sense voltage $V_{SEN}$ at a voltage level relative to a trip voltage level Vtrip that provides an indication of the state of the target memory cell MC(T), such as whether the target memory cell MC(T) is sufficiently programmed. The trip voltage level may be and/or correspond to the threshold voltage of the sense transistor 1338. If the sense voltage $V_{SEN}$ in the fifth period is at or above the threshold voltage of the sense transistor 1338, then the sense voltage $V_{SEN}$ may turn on the sense transistor 1338 to indicate that the target memory cell MC(T) is sufficiently programmed. Alternatively, if the sense voltage $V_{SEN}$ in the fifth period is below the threshold voltage of the sense transistor 1338, then the sense voltage $V_{SEN}$ may turn off the sense transistor 1338 to indicate that the target memory cell MC(T) is not sufficiently programmed.

In order to accurately indicate the state of the target memory cell MC(T), the voltage level to which the sense voltage $V_{SEN}$ drops during the fifth period is supposed to correspond to the threshold voltage of the sense resistor 1338. However, if the final pre-charge voltage level is a level that is independent of and/or that does not correspond to the specific threshold voltage of the sense transistor 1338 of the selected sense circuit—e.g., the voltage level is a general or global level at which all of the selected sense circuit generate their respective sense voltages $V_{SEN}$ during the third period—then, because of the capability of the various sense transistors of the sense circuits to have different threshold voltages due to process variations, the voltage level generated during the fifth period may not correspond to the specific threshold of the sense transistor 1338 of the selected sense circuit. As a result the general or global voltage level of the sense voltage $V_{SEN}$ generated during the fifth period may not accurately indicate the state of the target memory cell MC(T). In contrast, by generating the final pre-charge voltage level according to the threshold voltage tracking methodology, the selected sense circuit may generate the sense voltage $V_{SEN}$ at a final pre-charge level, and in turn at a voltage level during the fifth period, that accurately indicates the threshold voltage level that is specific to the sense voltage 1338 of the selected sense circuit. As a result, the sense voltage $V_{SEN}$ generated during the fifth period may accurately indicate the state of the target memory cell MC(T).

In order to generate the sense voltage $V_{SEN}$ at the final pre-charge voltage level VSWING+Vt according to the threshold voltage tracking methodology, the selected sense circuit may configure its sense transistor 1338 as a diode-connected transistor. To do so, the sense circuit controller 1206 may connect or tie together the gate and drain terminals of the sense circuit 1338 by turning on both the BLQ transistor 1334 and the STB transistor 1336. As shown in FIG. 14, the sense circuit controller 1206 may do so by outputting the BLQ control signal and the STB control signal each at the high voltage level VX2, beginning at the start of the discharge stage (i.e., at the seventh time t7).

At or shortly after the seventh time t7, a threshold voltage tracking circuit path may form from the sense node SEN to the threshold voltage tracking node VTT via the BLQ transistor 1334, the STB transistor 1336, and the diode-connected sense transistor 1338 due to the BLQ transistor 1334 and the STB transistor 1336 turning on to connect the gate and drain terminals of the sense transistor 1338 together. In response to the gate and drain terminals biased at the initial pre-charge level VSWING+Vt_max and the source terminal biased at the swing voltage level VSWING, current may flow through the threshold voltage tracking circuit path, which may cause a voltage drop between the gate and source terminals of the sense transistor 1338 to be the threshold voltage specific to the sense transistor 1338. That is, with the voltage source terminal of the sense transistor 1338 set to the swing voltage level VSWING, the threshold voltage tracking circuit path may set the voltage of the gate terminal—i.e., the sense voltage $V_{SEN}$—to the swing voltage level VSWING plus the threshold voltage Vt specific to the sense transistor 1338. Provided that the threshold voltage Vt specific to the sense transistor 1338 is lower than the maximum possible threshold voltage Vt_max, then the sense voltage $V_{SEN}$ may decrease from the initial pre-charge voltage level VSWING+Vt_max to the final pre-charge voltage level VSWING+Vt, starting at the seventh time t7 as shown in FIG. 14. In this context, the threshold voltage tracking circuit path generates the sense voltage $V_{SEN}$ to the final pre-charge voltage level VSWING+Vt according to a threshold voltage tracking methodology since the final pre-charge voltage level VSWING+Vt tracks the threshold voltage Vt specific to the sense transistor 1338.

At the seventh time t7, FIG. 14 shows two curves branching off from the curve of the sense voltage $V_{SEN}$ of the selected sense circuit, including a first curve 1408 and a second curve 1410. The two curves 1408, 1410 represent two possible different voltage waveforms that may be generated as a result of different possible threshold voltages of the sense transistor 1338, illustrating the selected sense circuit's incorporation of the threshold voltage tracking methodology to generate the sense voltage $V_{SEN}$ at a voltage level specific to the threshold voltage of the sense transistor 1338.

FIG. 14 also shows two curves 1412, 1414 branching off from the curve of the BUS1 voltage $V_{BUS1}$ of the selected sense circuit at the seventh time t7, which represent two possible different voltage waveforms that may be generated as a result of the different possible threshold voltages of the sense transistor 1338. As depicted by the two curves 1412, 1414, the voltage level of the BUS1 voltage $V_{BUS1}$ may track or follow the voltage level of the sense voltage $V_{SEN}$ during the discharge stage due to the BLQ transistor 1334 being turned on and shorting together the sense node SEN and the first bus BUS1.

By an eighth time t8 during the discharge stage, the threshold voltage tracking circuit path may be generating the sense voltage $V_{SEN}$ of the selected sense circuit at the final pre-charge voltage level VSWING+Vt. In turn, the sense circuit controller 1206 may turn off the BLQ transistor 1334 and the STB transistor 1336 by lowering the voltage levels of the BLQ control signal and the STB control signal from the high voltage level VX2 to the low voltage level, which disables the threshold voltage tracking path.

The fourth period (Period 4) starting at the ninth time t9, is a sense period during which the selected sense circuit generates the sense voltage $V_{SEN}$ at a voltage level corresponding to current flow through the associated selected bit line. The fourth, sense period may be separated into two sub-periods, including a charge sub-period followed by a bit line connection or discharge sub-period.

In the charge sub-period starting at the ninth time t9, the voltage supply circuitry may begin supplying the input pulse CLKSA at a voltage level VCLK to the pulse nodes CLK of the selected and unselected sense circuits. In response to receipt of the input pulses, the charge storing circuits 172 of each of the selected and unselected sense circuits may increase their respective sense voltages $V_{SEN}$ by an amount equal or corresponding to the voltage level of the input pulse CLKSA multiplied by their respective coupling ratio Cr, which is denoted in FIG. 14 as VCLK*Cr. In general, the coupling ratio Cr is a fraction or percentage in a range between zero and one. The coupling ratio Cr is indicative of the charge-storing circuit's 1358 ability to transfer energy from one of its ends to the other. In addition or alternatively, the coupling ratio Cr may indicate the fraction of the voltage level VCLK of the input pulse CLKSA by which the charge-storing circuit 1358 will increase the sense voltage $V_{SEN}$ at the sense node SEN. The voltage level of the sense voltage $V_{SEN}$ in response to receipt of the input pulse CLKSA is referred to as the charge level. As shown in FIG. 14, in the selected sense circuit, in response to receipt of the input pulse CLKSA, the charge-storing circuit 1358 may increase the sense voltage $V_{SEN}$ to an associated charge level VSWING+Vt+(VCLK*Cr). In the unselected sense circuit, the charge-storing circuit 1358 may increase the sense voltage $V_{SEN}$ to an associated charge level VCLK*Cr.

Also, as previously described, the sense voltage $V_{SEN}$ in the selected sense circuit may be generated at different possible voltage levels depending on the specific threshold voltage of the sense transistor 1338, as depicted by curves 1408 and 1410 in FIG. 14. FIG. 14 then shows the two curves 1408, 1410 as staying separate over the subsequent fourth and fifth periods since the voltage level of the sense voltage $V_{SEN}$ generated in the fourth and fifth periods will correspondingly depend on the specific threshold voltage of the sense transistor 1338 as a result of the threshold voltage tracking performed in the third period.

As described in further detail below, the selected sense circuit may perform a detection operation in the fifth period in which the selected sense circuit generates the BUS1 voltage $V_{BUS1}$ at a sense result voltage level, which may be either its associated intermediate voltage level VDDSA-Vt or its associated low voltage level, such as the ground reference voltage. In the fourth period, the selected sense circuit may set the BUS1 voltage $V_{BUS1}$ to the associated intermediate voltage level VDDSA-Vt in preparation of the detection operation in the fifth period. As shown in FIG. 14, starting at the ninth time t9, the sense circuit controller 1206 may increase the voltage level of the LPC control signal first to the intermediate voltage level VDDSA and then to the high voltage level VX2 to turn on the LPC transistor 1344. Also, at the ninth time t9, the voltage source of the voltage supply circuitry that is supplying the second high supply voltage VHLB may be generating the second high supply voltage VHLB with the external voltage supply instead of charge pump circuitry. As such, when the sense circuit controller 1206 increases the voltage level of the LPC control signal to turn on the LPC transistor 1344, the LPC transistor 1344 may respond by decreasing the voltage level of the BUS1 voltage $V_{BUS1}$ to the associated intermediate voltage level VDDSA-Vt, as shown in FIG. 14. Also, because the LPC control signal is a global signal that is sent to both the selected sense circuit and the unselected sense circuit, the LPC transistor 1344 of the unselected sense circuit may respond to the LPC control signal starting at the ninth time t9 by increasing the BUS1 voltage $V_{BUS1}$ in the unselected sense circuit up to the intermediate voltage level VDDSA-Vt, as shown in FIG. 14. Accordingly, shortly after the ninth time t9 in the fourth period, the BUS1 voltage $V_{BUS1}$ in the selected and unselected sense circuits are both at the intermediate voltage level VDDSA-Vt.

Additionally, at the ninth time t9, the threshold voltage tracking voltage source 1340 may output the first supply voltage $V_1$ to increase the voltage level of the threshold voltage tracking voltage $V_{VTT}$ to the intermediate voltage level VDDSA. The increase in the voltage level of the threshold voltage tracking voltage $V_{VTT}$ may correspond to or coincide with the increase of the sense voltage $V_{SEN}$ in response to the input pulse CLKSA at the ninth time t9. The increase in the threshold voltage tracking voltage $V_{VTT}$ may coincide with the increase in the sense voltage $V_{SEN}$ in order to maximize the coupling ratio Cr.

As shown in FIG. 14, in the third period at the eighth time t8, the sense circuit controller 1206 may output the first control signal CTRL1 to the first switch 1342 to connect the threshold voltage tracking node VTT to the ground reference GND in order to pull down the level of the threshold voltage tracking voltage $V_{VTT}$ from the swing voltage level VSWING to the ground reference voltage. Accordingly, then, in the fourth period at the ninth time t9, the sense circuit controller 1206 may output the first control signal CTRL1 to cause the first switch 1342 to reconnect the threshold voltage tracking node VTT to the threshold voltage tracking voltage source 1340, which in turn may cause the threshold voltage tracking voltage $V_{VTT}$ to increase to the intermediate voltage level VDDSA. The sense circuit controller 1206 may lower the threshold tracking voltage $V_{VTT}$ to the ground reference voltage in preparation of the increase of the threshold voltage tracking voltage $V_{VTT}$ at the ninth time t9. In general, the larger the increase in voltage of the threshold voltage tracking voltage $V_{VTT}$, the greater the maximization of the coupling ratio. As such, lowering the threshold voltage tracking voltage $V_{VTT}$ to the ground reference voltage at the eighth time t8 and then increasing it to the intermediate voltage level VDDSA at the ninth time t9 may better maximize the coupling ratio compared to if the lowering of the voltage level is not performed between the eighth and ninth times t8, t9 because the voltage swing from the ground reference voltage to the intermediate voltage level VDDSA is greater than the voltage swing from the swing voltage level VSWING to the intermediate voltage level VDDSA.

The tenth time t10 in the fourth period may mark the start of the bit line connection sub-period, which extends to an eleventh time t11. Although not shown by a waveform in FIG. 10, at the tenth time t10, the sense controller 1206 may output the sense enable control signals CTRLS to the sense enable circuits 1332 in the selected and unselected sense circuits in order for sensing to be performed in the selected sense circuit. In both the selected sense circuit and the unselected sense circuit, the sense enable circuits 1332 may be enabled to form a short circuit or a relatively low resistance path from a first terminal of the sense enable circuit 1332 connected to the sense node SEN to a second terminal connected to the bit line connection circuit 1328.

With respect to the selected sense circuit, enabling the sense enable circuit 1332 electrically connects the sense node SEN to the selected bit line, forming a current path from the sense node SEN to the bit line bias node VBL (i.e., through the sense enable circuit 1332 and the bit line connection circuit 1328). If the selected bit line is drawing current, charge that accumulated at the sense node SEN by the charge-storing circuit 1358 may discharge by flowing through the current path into the selected bit line. The level of the sense voltage $V_{SEN}$ generated by the charge-storing circuit 1358 may decrease in response to the accumulated charge being discharged. In addition, the rate at which level of the sense voltage $V_{SEN}$ decreases is proportional to the rate at which the accumulated charge discharges. During the bit line connection sub-period, the selected sense circuit may be considered to be sensing the current drawn through the selected bit line to which it is connected.

On the other hand, with respect to the unselected sense circuit, current does not flow through the unselected bit line. Accordingly, when the sense enable circuit 1332 is enabled, charge accumulated on the SEN node does not discharge through the unselected bit line. As such, the sense voltage $V_{SEN}$ generated in the unselected sense circuit stays constant during the bit line connection period even though the sense enable circuit is turned enabled. FIG. 14 shows the voltage level of the sense voltage $V_{SEN}$ staying constant during the bit line connection period between the tenth and eleventh times t10, t11.

Because target memory cells may have different threshold voltages $V_{TH}$ for a given sense operation, the amount of current a selected bit line may draw during a sense operation may vary. In a sense operation performed as part of a verify operation, when the target memory cell MC(T) is sufficiently programmed—i.e., the target memory cell's threshold voltage $V_{TH}$ is at a sufficiently high level corresponding to the memory state at which the target memory cell MC(T) is to be programmed—the sense voltage $V_{SEN}$ will fall by the swing voltage amount VSWING by the eleventh time t11. The curves 1408, 1410 in FIG. 14 depict that situation, where the target memory cell MC(T) is sufficiently programmed, and so the sense voltage $V_{SEN}$ decreases by the swing voltage amount VSWING by the eleventh time t11. That is, at the start of the bit line connection period at the tenth time t10, the voltage level of the sense voltage $V_{SEN}$ is its associated charge level VSWING+Vt+(VCLK*Cr), and at the end of the bit line connection period at the eleventh time t11, the voltage level of the sense voltage $V_{SEN}$ is Vt+(VCLK*Cr). In other sense operations that are part of verify operations, if the target memory cell MC(T) is under-programmed—i.e., the target memory cell's threshold voltage $V_{TH}$ is not high enough—the sense voltage $V_{SEN}$ may decrease by an amount greater than the swing voltage amount VSWING since a larger amount of current will flow through the selected bit line.

At the eleventh time t11, the sense circuit controller 1206 may output the sense enable control signals to turn off the sense enable circuits 1332 in the selected and unselected sense circuits, marking the end of the bit line connection sub-period and the start of the fifth period (Period 5), which may be referred to as the detection period. Also, at the eleventh time t11, the voltage supply circuitry may stop the supply of the input pulse CLKSA by pulling down the voltage of the input pulse from its pulse voltage level VCLK to its associated low voltage level. Additionally, the sense circuit controller 1206 may output the first control signal CTRL1 to connect the threshold voltage tracking node VTT to the ground reference GND and pull down the threshold voltage tracking voltage $V_{VTT}$ from the intermediate voltage level VDDSA to the ground reference voltage.

In response to supply of the input pulse CLKSA being stopped, the sense voltages $V_{SEN}$ in the selected and unselected sense circuits may fall from the eleventh time t11 to a twelfth time t12 by an amount equal to the pulse voltage level VCLK times the coupling ratio Cr of the charge-storing device 1358. For the example sense operation described with reference to FIG. 14, in the selected sense circuit, the sense voltage $V_{SEN}$ may fall from the level Vt+(VCLK*Cr) at the eleventh time t11 to the threshold voltage level Vt of the sense transistor 1338 at or around the twelfth time t12. For other example sense operations that are part of verify operations, where the target memory cell MC(T) is under-programmed, and when the supply of the input pulse CLKSA stops, the sense voltage $V_{SEN}$ in the selected sense circuit may fall to a level below the threshold voltage Vt of the sense transistor 1338. Additionally, in the unselected sense circuit, the sense voltage $V_{SEN}$ may fall from the level VCLK*Cr to the ground reference voltage level.

In the selected sense circuit, the voltage level to which the sense voltage $V_{SEN}$ falls by the twelfth time t12 may be referred to as its detection level, as that level is used to detect a state or characterization of the target memory cell MC(T). The sense circuit controller 1206 may be configured to determine a state or characterization of the target memory cell MC(T) by performing a detection operation (also referred to as a strobe operation) that identifies whether the detection level is at or above the threshold voltage level Vt of the sense transistor 1338, or below the threshold voltage level Vt of the sense transistor 1338. The threshold voltage level Vt of the sense transistor 1338 may also be referred to as a trip voltage level Vtrip.

When the detection level of the sense voltage $V_{SEN}$ is at or above the threshold trip voltage level Vtrip, the sense voltage $V_{SEN}$ is at a detection level that is capable of turning on the sense transistor 1338 such that the sense transistor 1338 can pull down the voltage level of the BUS1 voltage $V_{BUS1}$ from its intermediate level VDDSA-Vt to its low voltage level. Alternatively, when the detection level of the sense voltage $V_{SEN}$ is below the trip voltage level Vtrip, the sense voltage $V_{SEN}$ is at a detection level that is incapable of turning on the sense transistor 1338, such that the sense transistor 1338 is incapable of pulling down the BUS1 voltage $V_{BUS1}$ from its intermediate voltage level VDDSA-Vt to its low voltage level.

During the detection operation, the sense circuit controller 1206 may identify the level of the BUS1 voltage $V_{BUS1}$ to determine whether the detection level of the sense voltage $V_{SEN}$ is at or above the trip voltage level Vtrip or below the trip voltage level Vtrip. In particular, if the sense circuit controller 1206 identifies that the BUS1 voltage $V_{BUS1}$ is at its low voltage level, the sense circuit controller 1206 may determine that the detection level is at or above the trip voltage level Vtrip since the sense transistor 1338 pulled down BUS1 voltage $V_{BUS1}$ from its intermediate voltage level VDDSA-Vt to its low voltage level. Alternatively, if the sense circuit controller 1206 identifies that the BUS1 voltage $V_{BUS1}$ is at its intermediate voltage level VDDSA-Vt, then sense circuit controller 1206 may determine that the detection level is below the trip voltage level Vtrip because the sense transistor 1338 did not pull down the BUS1 voltage $V_{BUS1}$ from its intermediate voltage level VDDSA-Vt to its low voltage level. The voltage level of the BUS1 voltage $V_{BUS1}$ that is used to determine if the detection level of the sense voltage $V_{SEN}$ is at or above the trip voltage level Vtrip or below the trip voltage level Vtrip may be referred to as the sense result voltage level of the BUS1 voltage $V_{BUS1}$.

To perform the detection operation, at the twelfth time t12, the sense circuit controller 1206 may output the STB control signal to turn on the STB transistor 1336 in at least the selected sense circuit. The sense circuit controller 1206 may also lower the voltage level of the LPC control signal from the high voltage level VX2 to the low voltage level to turn off the LPC transistor 1356 so that the LPC transistor does not influence the voltage level of the BUS1 voltage $V_{BUS1}$ during the detection operation.

In response to the STB transistor 1336 turning on, if the BUS1 voltage $V_{BUS1}$ falls from its intermediate voltage level VDDSA-Vt to its low voltage level, then the sense circuit controller 1206 may determine that the detection level of the sense voltage $V_{SEN}$ is at or above the trip voltage level Vtrip. Alternatively, in response to the STB transistor 1336 turning on, if the BUS1 voltage $V_{BUS1}$ stays at its intermediate voltage level VDDSA-Vt, then the sense circuit controller 1206 may determine that the detection level of the sense voltage $V_{SEN}$ is below the trip voltage level Vt.

In the example sense operation shown in FIG. 14, the sense voltage $V_{SEN}$ in the selected sense circuit falls to a detection level that is above the trip voltage level Vtrip. As such, when the sense circuit controller 1206 outputs the STB control signal at the high voltage level VX2 at the twelfth time t12 to turn on the STB transistor 1336, both the STB transistor 1336 and the sense transistor 1338 in the selected sense circuit are turned on to pull down the sense voltage $V_{SEN}$. Curve 1416 in FIG. 14 shows the BUS1 voltage $V_{BUS1}$ in the selected sense circuit being pulled down to the low voltage level. Also, in the unselected sense circuit, the sense voltage $V_{SEN}$ is below the trip voltage level Vtrip, and so the BUS1 voltage $V_{BUS1}$ in the unselected sense circuit stays at the intermediate voltage level VDDSA-Vt, as indicated by curve 1418.

Where the detection level is relative to the trip voltage level Vtrip may convey information about or a characterization of the state of the target memory cell MC(T) connected to the selected bit line, such as whether it is fully conducting, marginally conducting, or non-conducting, which in turn may convey information about the threshold voltage $V_{TH}$ of the target memory cell MC(T). For example, in a situation where the sense operation is performed as part of a read operation, a detection level above the trip voltage level Vtrip may indicate that the target memory cell MC(T) has a threshold voltage $V_{TH}$ above a read reference voltage level Vr (see FIGS. 11A-11C) for an associated selected word line voltage applied to the selected word line WL(S). Alternatively, a detection level below the trip voltage level Vtrip may indicate that the target memory cell MC(T) has a threshold voltage $V_{TH}$ below a read reference voltage level Vr for an associated selected word line voltage applied to the selected word line WL(S). As another example, in a situation where the sense operation is performed as a verify portion of a program-verify operation, a detection level at or above the trip voltage level Vtrip may indicate that the target memory cell MC(T) is sufficiently programmed to its assigned memory state. Alternatively, a detection level below the trip voltage level Vtrip may indicate that the target memory cell MC(T) is insufficiently programmed, and thus needs to be subjected to another program-verify loop.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
a sense circuit coupled to a bit line, the sense circuit comprising:
a pre-charge circuit path configured to pre-charge a sense node with a voltage at a pre-charge level during a sense operation; and
a latch circuit configured to:
in response to receiving a control signal at a high voltage level at a first transistor of the latch circuit:
enable the pre-charge circuit path to pre-charge the sense node with the voltage at the pre-charge level at a point in time during a pre-charge period of a sense operation in response to the bit line comprising a selected bit line; and
disable the pre-charge circuit path to prevent the pre-charge circuit path from pre-charging the sense node with the voltage at the pre-charge level at the point in time during the pre-charge period in response to the bit line comprising an unselected bit line.

2. The circuit of claim 1, wherein the sense circuit further comprises:
a discharge circuit path configured to discharge charge accumulated on the sense node before the pre-charge circuit path pre-charges the sense node with the voltage at the pre-charge level during the sense operation.

3. The circuit of claim 2, wherein transistors that form the pre-charge circuit path to pre-charge the sense node are the same transistors that form the discharge path to discharge charge accumulated on the sense node.

4. The circuit of claim 3, wherein the transistors are configured to be alternatingly connected to a voltage source and a ground reference, wherein the transistors are configured to connect to the voltage source to receive a supply voltage while forming the pre-charge circuit path, and are configured to connect to the ground reference while forming the discharge circuit path.

5. The circuit of claim 1, further comprising a communications bus that connects the sense circuit and the latch circuit,
wherein the latch circuit is configured to pull down a voltage of the communications bus to an associated low voltage level to disable the pre-charge circuit path.

6. The circuit of claim 1, wherein the latch circuit is configured to perform a latch read operation to disable the pre-charge circuit path.

7. The circuit of claim 6, further comprising a communications bus that connects the sense circuit and the latch circuit,
wherein the latch circuit is configured to receive a control signal to perform the latch read operation,
wherein the latch circuit is configured to set a voltage of the communications bus to a low voltage level to disable the pre-charge circuit path in response to the control signal when the bit line comprises an unselected bit line, and
wherein the latch circuit is configured to float relative to the communications bus to enable the pre-charge circuit path in response to the control signal when the bit line comprises a selected bit line.

8. The circuit of claim 1, wherein the pre-charge circuit path is configured to pre-charge the sense node to generate a sense voltage at an initial pre-charge level, wherein the circuit further comprises a threshold voltage tracking circuit path configured to configure the sense transistor as a diode-connected transistor to generate the sense voltage at a final pre-charge level.

9. The circuit of claim 8, further comprising a voltage source configured to output a supply voltage to generate a threshold voltage tracking voltage at a source terminal of the sense transistor, and wherein a voltage difference between the initial pre-charge level of the sense voltage and a level of the threshold voltage tracking voltage is a maximum threshold voltage of the sense transistor.

10. The circuit of claim 9, further comprising a charge-storing circuit connected to the sense node, wherein the charge-storing circuit is configured to receive an input pulse to increase the sense voltage, and
wherein the voltage source is configured to increase the threshold voltage tracking voltage to coincide with the increase of the sense voltage in response to receipt of the input pulse.

11. The circuit of claim 10, further comprising a sense circuit controller configured to lower the threshold voltage tracking voltage in preparation of the increase of the threshold voltage tracking voltage.

12. The circuit of claim 1, wherein the latch circuit comprises a first inverter and a second inverter cross-coupled with the first inverter to form a select node and an unselect node.

13. The circuit of claim 12, wherein the latch circuit further comprises:
   a second transistor connected to the first inverter along with the first transistor; and
   third and fourth transistors connected to the second inverter.

14. The circuit of claim 1, wherein pre-charging the sense node with the voltage at the pre-charge level comprises generating a sense voltage at an initial pre-charge voltage level and then at a final pre-charge voltage level.

15. The circuit of claim 1, wherein pre-charging the sense node with the voltage at the pre-charge level comprises a charge stage and a discharge stage.

16. The circuit of claim 1, wherein the control signal transitions to a low voltage level at the end of the sense operation.

* * * * *